(12) United States Patent
Jara

(10) Patent No.: US 6,823,205 B1
(45) Date of Patent: Nov. 23, 2004

(54) SYNTHETIC IMAGES FOR A MAGNETIC RESONANCE IMAGING SCANNER USING LINEAR COMBINATION OF SOURCE IMAGES TO GENERATE CONTRAST AND SPATIAL NAVIGATION

(75) Inventor: Hernan Jara, Belmont, MA (US)

(73) Assignee: Boston University Radiology Associates, Boston, MA (US)

( * ) Notice: Subject to any disclaimer, the term of this patent is extended or adjusted under 35 U.S.C. 154(b) by 666 days.

(21) Appl. No.: 09/779,770

(22) Filed: Feb. 8, 2001

(51) Int. Cl.[7] ............................. A61B 5/05; G01V 3/00
(52) U.S. Cl. ...................................... 600/410; 324/307
(58) Field of Search ................................ 600/410, 407, 600/408, 409, 411, 416, 436; 324/307, 308, 309; 436/123

(56) References Cited

U.S. PATENT DOCUMENTS

| | | | | |
|---|---|---|---|---|
| 4,812,753 A | * | 3/1989 | Fuderer et al. ............. | 324/307 |
| 4,830,012 A | * | 5/1989 | Riederer ..................... | 600/410 |
| 5,490,509 A | * | 2/1996 | Carlson et al. ............. | 600/410 |
| 5,755,666 A | * | 5/1998 | Bornert et al. ............. | 600/410 |
| 5,910,728 A | * | 6/1999 | Sodickson .................. | 324/309 |
| 6,185,444 B1 | * | 2/2001 | Ackerman et al. .......... | 600/410 |
| 6,289,232 B1 | * | 9/2001 | Jakob et al. ................ | 600/410 |
| 6,307,368 B1 | * | 10/2001 | Vasanawala et al. ........ | 324/309 |
| 6,476,606 B2 | * | 11/2002 | Lee ............................. | 324/309 |

* cited by examiner

*Primary Examiner*—Daniel Robinson
(74) *Attorney, Agent, or Firm*—Cesari and McKenna, LLP

(57) ABSTRACT

The invention consists of three image-postprocessing phases for the purposes of generating high-quality quantitative MR images (proton density (PD), T1, and T2) as well as high-quality virtual MR images with continuously adjustable computer-synthesized contrast weightings, from source images acquired directly with an MRI scanner. Each of the image-postprocessing phases uses one or several new computer algorithms that improve image quality with respect to prior art, including linear-combination-of source-images (LCSI) algorithms for generating PD images and model-conforming algorithms for generating Q-MR images of tissue properties that influence NMR relaxation.

40 Claims, 10 Drawing Sheets

SYNTHETIC IMAGES FOR A MAGNETIC RESONANCE IMAGING SCANNER USING LINEAR COMBINATION OF SOURCE IMAGES TO GENERATE CONTRAST AND SPATIAL NAVIGATION

BACKGROUND OF THE INVENTION

1. Field of the Invention

This invention relates to magnetic resonance imaging (MR imaging), and more particularly to computing quantitative images as well as synthetic images from scan data, with the purpose of allowing the user to perform virtual MRI scanning retrospectively and not requiring the presence of the patient.

2. Background Information

In magnetic resonance image scanning (MRI scanning), images of a subject, usually a patient's body, are produced through the interaction of a magnetic field applied to the patient's body and the magnetic moment of protons. Each proton behaves as small bar magnet, and the strength of the bar magnet is referred to as the "magnetic moment" of the proton. All protons have the same value of magnetic moment, just as each proton has the same value of electric charge. The protons are the nuclei of hydrogen atoms. The hydrogen is chemically bonded in compounds of the patient's tissue.

It is standard engineering practice in MRI imaging to apply a strong magnetic field substantially parallel to the spinal column of the patient. This magnetic field is referred to as the "longitudinal magnetic field" and is represented in symbols as $B0$. Upon the application of the longitudinal magnetic field, protons in the patient's tissue align with the magnetic field to produce a magnetization (longitudinal magnetization) of the patient's tissue. The longitudinal magnetization is a vector quantity that points along the applied longitudinal magnetic field. The magnetization of the patient's tissue may be represented as formed by many protons aligned with the longitudinal magnetic field.

The patient's magnetization is used to produce images by observing its response to a magnetic field applied by radio frequency pulses, where the radio frequency magnetic field is applied perpendicular to the longitudinal magnetic field. The frequency of the radio frequency magnetic field is chosen, along with the time duration of the application of the radio frequency magnetic field, to cause the protons to rotate, more precisely to precess, by a desired angle. The angle by which the protons rotate, or precess, is referred to as the "flip angle". Ordinarily, radio frequency magnetic fields are applied to rotate the protons through an angle of 180 degrees so that their magnetization points in the reverse direction of the applied longitudinal magnetic field (that is into the anti-parallel direction), or to rotate the protons through an angle of 90 degrees so that their magnetization points into a plane perpendicular to the direction of the applied longitudinal magnetic field, that is into the "transverse plane". Other values of the flip angle may also be employed in MRI imaging.

An image reproducing the proton density in the patient's body may be obtained by applying a radio frequency field for a time sufficient to rotate the proton magnetization through to a 90-degree angle, and such an application of a radio frequency magnetic field is referred to as applying a "90 degree" RF pulse. Upon application of a 90 degree RF pulse, the protons are rotated from a direction substantially parallel to the longitudinal magnetic field into a direction substantially perpendicular to the longitudinal magnetic field. The proton magnetic moments, during this rotation, remain substantially aligned with each other, so the patient magnetization becomes a vector in the plane perpendicular to the longitudinal magnetic field. The plane perpendicular to the longitudinal magnetic field is referred to as the "transverse plane".

The patient's magnetization in the transverse plane is substantially equal in magnitude to the value that it had before application of the 90 degree RF pulse, however the patient's magnetization points in a direction in the transverse plane. For example, the transverse plane can be described with an X-axis and a Y-axis, and the X-axis may be chosen so that it is aligned with the magnetization in the transverse plane at the end of the 90-degree RF pulse. The magnetization in the transverse plane rotates in the transverse plane, and as a consequence of this rotation generates a radio frequency signal originating from the patient's tissue. This radio frequency signal is detected by a radio receiver, and is analyzed to produce an image.

A particular transverse plane is chosen for readout by applying a longitudinal magnetic field gradient, and choosing the frequency of the RF pulse to resonate with the protons in the chosen transverse plane. Ordinarily, changing the frequency of the RF pulse while longitudinal magnetic field gradient is held constant shifts the position of the desired transverse plane. The radio receiver receives the RF signal generated by the rotating magnetization, and the RF signal received by the radio receiver is spread over a frequency band, and with different phases, by the application of two transverse magnetic field gradients. For example, a transverse magnetic field gradient is applied, and a read out of emissions from the patient's tissue is obtained from the RF receiver. Again, a different transverse magnetic field gradient is applied, and a second readout is obtained from the RF receiver. A sequence of readouts is obtained, for different radio frequency values and for different phases, by applying different magnetic field gradients. A Fourier transform of the frequency and phase information received by the RF receiver is then computed. The output of the Fourier transform calculation produces the image of the patient's tissue. The image is presented as a two dimensional matrix of pixels.

After a first image is obtained, a waiting period is introduced. At the end of the waiting period a second image of the patient's tissue in the same transverse plane is obtained. The intensity of the radio frequency signal generated by the patient's tissue is reduced in the second image in comparison with the strength produced in the first image by transverse relaxation phenomena. Transverse relaxation phenomena are modeled by a transverse relaxation time, referred to as "T2". This reduction in the signal in the second image is used to compute the transverse relaxation time T2. The values of T2 may be computed at each pixel of the image.

Transverse relaxation phenomena, which are measured by the measured value of T2, are predominately caused by different protons in the transverse plane being subject to slightly different magnetic fields. The different magnetic fields throughout the transverse plane have their origin in several phenomena: the first being the magnetic field gradient which is intentionally applied to the transverse plane in order to obtain space resolution in the transverse plane; a second being different chemical environments of the protons in molecules within different regions of the transverse plane; and a third being movement of the protons through the tissue of the patient, such as caused by blood flow, etc.

Additionally, the protons in the transverse plane relax back to being parallel to the longitudinal magnetic field with a relaxation time referred to as "T1", where T1 is known as the "longitudinal relaxation time".

A 180-degree RF pulse may be applied to the patient's tissue. The result of the 180-degree RF pulse is that the proton magnetic moments are rotated 180 degrees. This rotation points the protons away from being parallel to the longitudinal magnetic field to being anti-parallel. The protons then relax toward the parallel orientation of the longitudinal magnetic field with the transverse relaxation time "T1". After a waiting time from the 180-degree pulse, a 90-degree RF pulse is then applied to the patient's tissue. The 90-degree RF pulse causes the net magnetization of the patient's tissue to rotate 90 degrees into the transverse plane where the magnetization precesses, and so produces an output RF signal from the patient's tissue. An image is again read out by using transverse magnetic field gradients and the RF receiver.

It is standard engineering practice to use a sequence of 180-degree RF pulses and 90-degree RF pulses in order to generate desired images by an MRI imaging apparatus.

In describing images of a patient's body taken by MRI imaging, it is necessary to introduce some additional geometric terminology. The patient's body is regarded as being made of slices, where the slices are in the transverse plane, that is in planes perpendicular to the longitudinal direction. The slices have thickness in the longitudinal dimension, for example a thickness of 0.5 millimeter, 1 millimeter, 2 millimeters, etc. (hereinafter millimeters will be abbreviated by "mm"). An "x" and "y" axis are defined as fixed in the patient's body, and the "x" and "y" axes lie in a transverse plane, where a "z" axis is introduced as lying along the longitudinal axis and parallel to the applied longitudinal magnetic field. Each of the slices is divided by lines parallel to the patient's "x" and "y" axes to form small rectangular parallelepiped elements of patient's tissue referred to as "voxels". A voxel is a small volume element of patient's tissue. The values of observed quantities in voxels are presented as a two-dimensional image, where each element in the two dimensional image is referred to as a "pixel". Quantities, which may be observed in a voxel during MRI imaging, are: proton density; value of transverse relaxation time T2 in the voxel; value of longitudinal relaxation time T1 in the voxel, etc. The values of the quantities observed in a voxel are then presented as a two dimensional image of pixels, where the image is usually presented on a computer screen where it may be photographed, printed by a computer printer, etc.

For example, an analysis of two images following a 90-degree RF pulse yields a value of the transverse relaxation time T2. For example, after application of the 90 degree RF pulse, a waiting time, referred to as "TE1" is observed. After the waiting time TE1 is observed, a readout of an image is obtained. After a further waiting time referred to as "TE2", a second image is obtained.

When a 90 degree RF pulse is applied to a patient, the first image that is taken after the TE1 waiting time is referred to as a proton density weighted image, a "PD weighted" image. The terminology "PD weighted image" is used because this is the first image in a sequence, and the intensity of the image in each voxel of the image is regarded as being proportional to the proton density in the corresponding voxel of the patient's transverse plane. The two-dimensional image of pixels generated from the intensity of the signal observed in the voxels is then presented on a computer screen, etc.

The second image produced after the TE2 waiting time is referred to as a "T2 weighted" image. The terminology "T2 weighted" image is used because the image is reduced in intensity at each voxel because of transverse relaxation processes, and so is dependent upon the value of T2 at each voxel of the transverse plane.

When a 180-degree RF pulse is applied to a patient, the longitudinal magnetization is rotated to an anti-parallel direction to the applied longitudinal magnetic field, and then the longitudinal magnetization begins relaxing back to the parallel direction with the relaxation time of T1. The value of T1 at each voxel may be determined by a sequence of images. Ordinarily the images to determine T1 are taken by: first, applying the 180 degree RF pulse to obtain anti-parallel orientation of the patient's longitudinal magnetization; second, by applying a 90 degree RF pulse after a longitudinal waiting time of invT from the 180 degree RF pulse to rotate the longitudinal magnetization into the transverse plane; and third by taking one or more subsequent images in order to obtain the value of T2 at each voxel of the slice. Images taken after at least two different values of longitudinal waiting time invT may then be analyzed to obtain a value of T1 at each voxel. These two images will be of different intensity because of the recovery of longitudinal magnetization caused by the longitudinal relaxation processes modeled by the longitudinal relaxation time T1. And the value of T1 may be different in each voxel, giving rise to images having different contrast information at the different values of waiting time invT.

It is standard engineering practice to take the images to determine T1 by the additional steps of: first applying a 90 degree RF pulse after the waiting time of invT from the 180 degree RF pulse to rotate the longitudinal magnetization into the transverse plane, and then taking an image after a waiting time of TE1, and a second image after an additional waiting time of TE2, where these values of TE1 and TE2 are the same as the waiting times for taking an image after an isolated 90 degree RF pulse. The images taken after an isolated 90 degree RF pulse, and after a 180 degree pulse followed by a 90 degree RF pulse, may then be combined in an analysis to obtain values of T1 and T2 at each voxel of the patient's body.

It is a standard clinical and engineering terminology to refer to: the first image after a 90 degree RF pulse as a "PD weighted" image (proton density image); the second image after a 90 degree RF pulse as a "T2 weighted" image; the first image after a 180 degree RF pulse and a waiting time of invT, then followed by a 90 degree pulse, as a "T1 weighted" image; and the second image after both the 180 degree RF pulse and the 90 degree RF pulse as a T1–T2 weighted image.

Clinical information is carried in the different images, the PD weighted image, the T1 weighted image, the T2 weighted image, the T1–T2 weighted image, and other images produced by a particular choice of RF pulse sequences. In order to produce images by different RF pulse sequences, it is necessary to place the patient in the MRI imaging scanner and to subject the patient to the desired sequence of RF pulses.

There is needed a way to improve the images obtained from the radio receiver data, so that clinical information may be obtained without regard to the sequence of RF pulses applied to the patient's tissue.

SUMMARY OF THE INVENTION

The invention consists of three image-postprocessing phases for the purposes of generating high-quality quantitative MR images (proton density (PD), T1, and T2) as well as high-quality virtual MR images with continuously adjustable computer-synthesized contrast weightings, from source images acquired directly with an MRI scanner. Each of the image-postprocessing phases uses one or several new computer algorithms that improve image quality with respect to prior art, as described in detail in the following sections of this document.

Specifically, the Image-postprocessing Phases are:
1) Generation of high-quality synthetic proton density images by computing linear combinations of source images (LCSI algorithms) that were directly acquired with an MRI scanner. The objective of this phase is to generate a high-quality computer representation of the patient for the purpose of virtual MRI scanning, or equivalently for using this representation as a cybernetic virtual patient. The source images used as input to the LCSI algorithm(s), which are directly acquired with the MRI scanner, may include one, several, or all the images generated with the application of the physical pulse sequence used to scan the patient. Furthermore, for the purpose of generating a computer representation of the patient for virtual MRI scanning, the specific applied MRI pulse sequence(s) as well as the number or the individual contrast weightings of the source images per slice generated with it, are not unique. As discussed below in this patent application, the first phase of the invention (i.e. generating proton density images as linear combinations of source images) was applied to source images that were generated with a pulse sequence known as mixed turbo spin-echo (MIX-TSE) but many other are possible. The MIX-TSE pulse sequence used here as an example, produced four images per anatomic slice, specifically: a PD weighted image, a T1 weighted image, a T2 weighted image, and a combination T1–T2 weighted image. The values of the coefficients for the LCSI algorithms are also not uniquely defined. These values are chosen first and foremost so as to produce accurate representations of the proton density spatial distribution within the slice and second, so as to maximize the signal-to-noise-ratio (SNR) of the generated image. Two exemplary sets of LCSI algorithms are discussed in this document: 1) LCSI-basic: consist of a simple set of linear coefficients that uses solely the source image that is closest to the proton density image, and 2) LCSI-maximum-SNR: consists of a set of coefficients obtained by means of an optimization algorithm to maximize signal to noise ratio, SNR, which uses all source images (4 in the case of this example). Once the values of the LCSI coefficients are chosen, LCSI proton density images (LCSI_PD) are calculated at every location of patient that was physically scanned with the MIX-TSE pulse sequence.
2) In the second phase of the invention, the values of longitudinal relaxation time T1 and transverse relaxation time T2 are computed at each scanned voxel of the patient using also the source images and by means of what will be referred to hereafter as model-conforming quantitative algorithms. The defining feature of model-conforming Q-MRI algorithms is that these are based on a physics model of tissue magnetism that is conditioned in response to signal-to-noise-ratio criteria in the source images. Specifically, in the model conforming algorithms the pixel values of the input source images are first compared to the noise level in the image, then, if these pixel values exceed the noise level the physics model applies, otherwise a predefined value for the output (T1 and T2) results. The use of model conforming algorithms is shown to reduce the incidence of inaccurate pixel values in Q-MR images as well as in synthetic images produces by virtual MRI scanning.
3) In the third phase of the invention, the values of the LCSI-proton density, T1, and T2 obtained for each voxel are then used to compute a synthetic MR image with computer-generated contrast weighting. In this phase, synthetic images representing any imaginable sequence of pulses may be computed. Also, the voxels may be rearranged to give slices through the patient's body at any desired orientation, for example slices parallel to the transverse plane, slices parallel to the longitudinal axis, and slices at any desired angle to the longitudinal axis and the transverse plane.

In summary, the quality—high SNR, negligible incidence of pixel dropout artifacts, and continuously adjustable contrast weightings—of the synthetic images produced with the algorithms of this invention, is consistently superior to that produced by prior art. These image quality improvements result primarily from using LCSI_PD images as the virtual patient, and secondarily from using model-conforming Q-MR images (e.g. T1 and T2) to produce contrast weighting in virtual MRI scanning.

BRIEF DESCRIPTION OF THE DRAWINGS

The invention description below refers to the accompanying drawings, of which.

DETAILED DESCRIPTION OF AN ILLUSTRATIVE EMBODIMENT

IMAGE ACQUISITION

MRI Scanner

Figure 1:
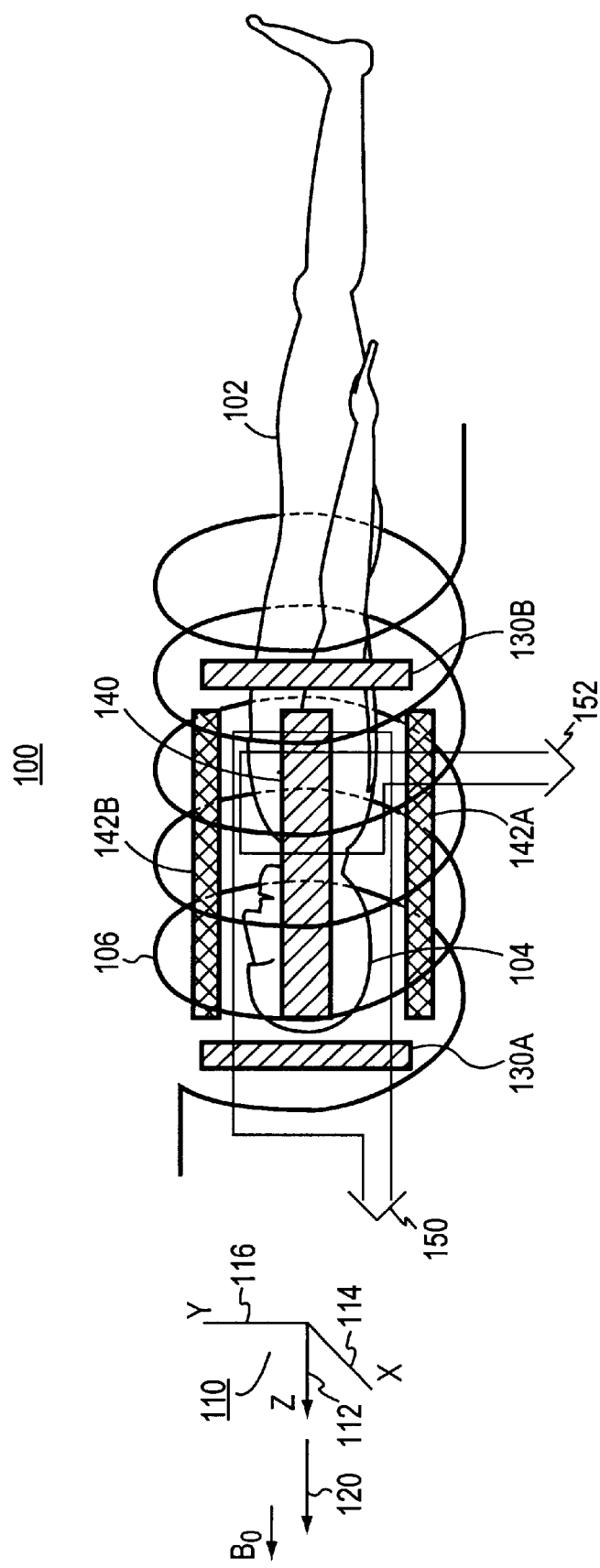
FIG. 1 is; a plan diagram of a patient in a MRI scanner.

Turning now to FIG. 1, an MRI scanner 100 with a patient 102 is shown. Patient 102 is shown having his head 104 positioned within the longitudinal magnetic field coil 106. Coordinate axes 110 have a z-axis 112 along the axis of longitudinal magnetic field coil 106, and an x-axis 114 and a y-axis 116 in a transverse plane. A transverse plane is perpendicular to the axis of the longitudinal magnetic field coil 106. The longitudinal magnetic field coil 106 generates a longitudinal magnetic field B0 120. The direction of longitudinal magnetic field B0 120 is along the axis of the longitudinal magnetic field coil 106, that is along the z-axis 112.

Longitudinal gradient magnetic field coil 130A and 130B are connected so as to produce a magnetic field gradient along the z-axis 112, so that the value of the longitudinal magnetic field 120 at the location of a desired transverse slice (not shown in FIG. 1) of the patient's body will have a desired value.

An x-axis magnetic field gradient coil 140A is shown, and the outline of the patient through the x-axis magnetic field gradient coil 140A is shown through the block representing the x-axis magnetic field gradient coil 140A. A matching x-axis magnetic field gradient coil is located behind the patient, is obscured by the x-axis magnetic field coil 140A, and so is not shown in FIG. 1.

A y-axis magnetic field gradient coils 142A and 142B are shown. In combination, the y-axis magnetic field gradient coils 142A, 142B produce a magnetic field gradient along the y-axis.

The z-axis magnetic field gradient coils 130A, 130B are used to select a transverse plane within the patient's body for scanning. The x axis magnetic field gradient coils 140A and the hidden coil which is not shown, in combination with the y axis magnetic field gradient coils 142A and 142B are used to provide a variation of the magnetic field in the selected transverse plane so that radio frequency signals may be received from the transverse plane, and an image of that transverse plane within the patient may be reconstructed from the received radio frequency signals.

Figure 13:
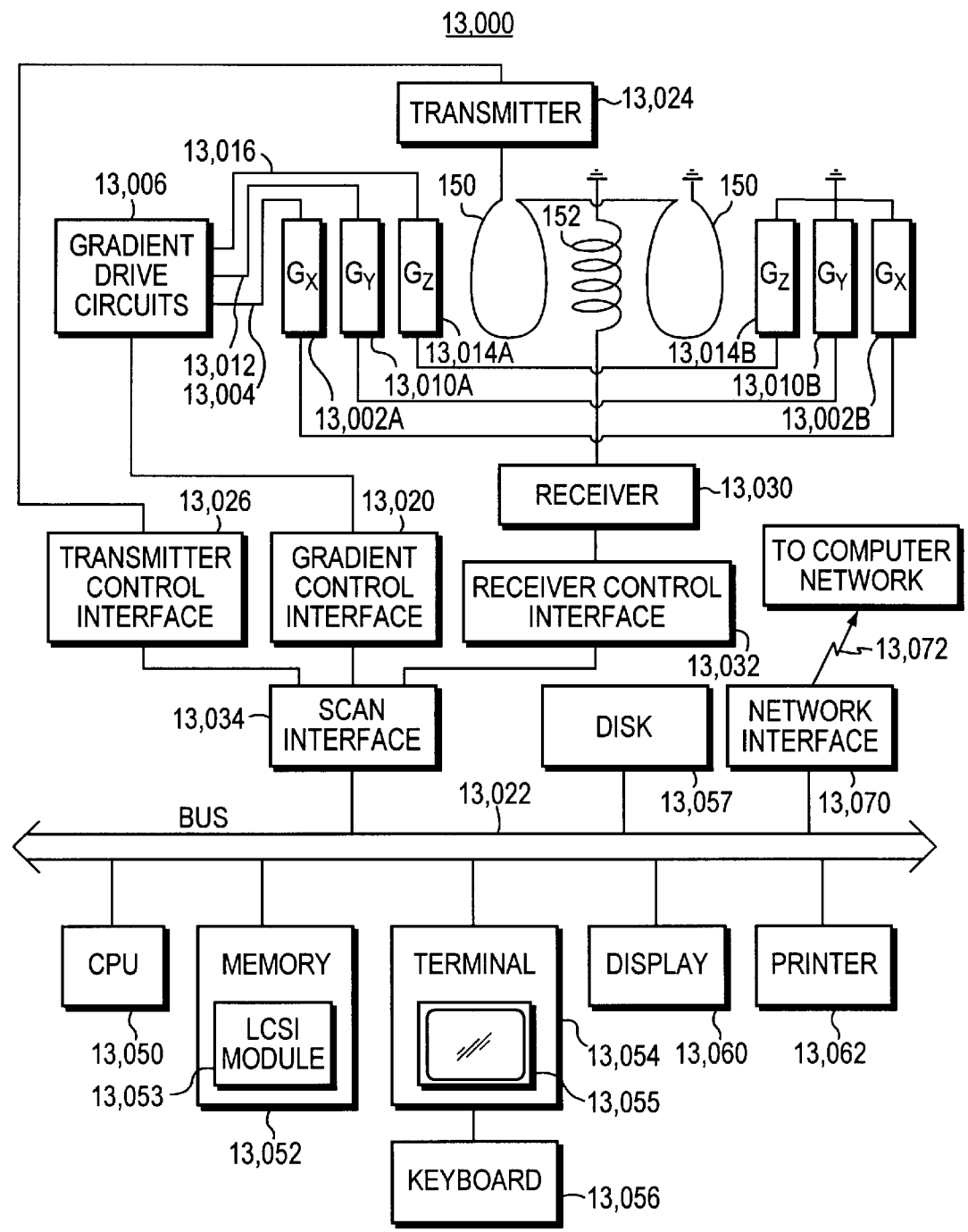
FIG. 13 is a block diagram of a physical-virtual MRI scanner with a connection to a computer network.

Radio frequency transmitting coil 150 receives radio frequency energy from a transmitter, as shown in FIG. 13, and emits radio frequency radiation which is absorbed by patient 102. Radio frequency receiving coil 152 receives the radio frequency emissions from the magnetization of the protons in the patient's 102 tissue.

Generation of images is thoroughly discussed by P. Mansfield and P. G. Morris in their book NMR *Imaging in Biomedicine*, published by Academic Press in 1982, all disclosures of which are incorporated herein by reference.

Mixed Turbo Spin-echo Pulse Sequence

Figure 2A:
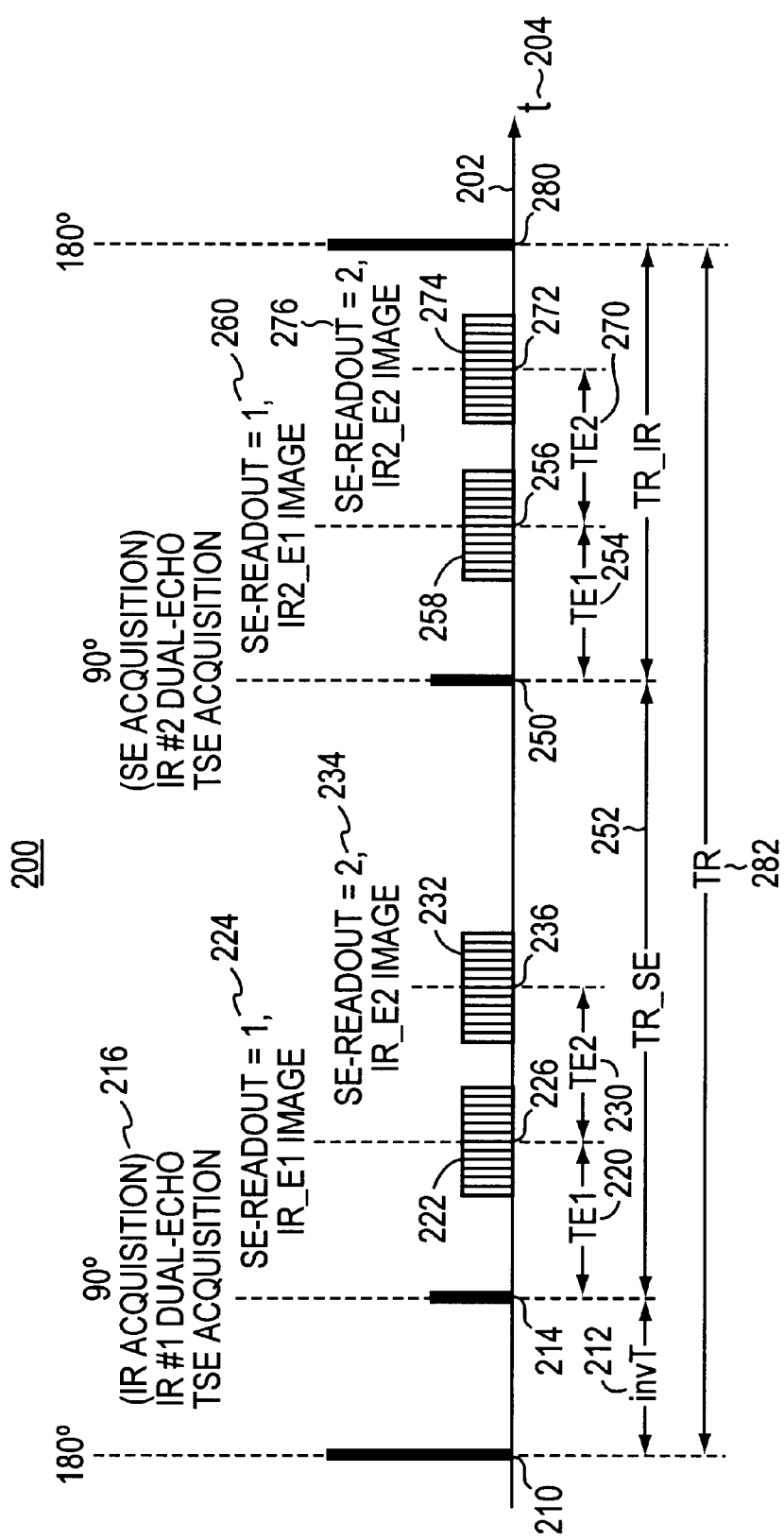
FIG. 2A is; is a timing diagram showing a sequence of scanning events.

Turning now to FIG. 2A, a timing diagram 200 for a sequence of events in operation of a MRI imaging scanner is shown. Time axis 202 is shown with time arrow 204. The first event shown, at time 210, is the application of a 180-degree RF pulse to the patient. After a waiting time of "invT" 212, at time 214 a 90-degree RF pulse is applied to the patient. The waiting time invT 212 is often referred to as the "inversion waiting time".

A first image is acquired at time 226, and a second image is acquired at time 236. The terminology for these images is that they are longitudinal relaxation images, or IR images, and they are E images, referring to the spin echo method of image acquisition, as shown by label 216. The images are IR images because of the initial 180 degree RF pulse applied at time 210 turned the patient's magnetization in the selected transverse slice into anti-parallel to the longitudinal magnetic field B0 120, and the waiting time invT 212 until time 214, when the 90 degree RF pulse was applied, after the patient's magnetization had an opportunity to relax during the waiting time invT back toward the parallel direction to the longitudinal magnetic field B0 120.

After a waiting time of TE1 220 a sequence of spin echo data acquisition events using a variety of transverse magnetic field gradients is acquired by the MRI imaging scanner, as shown by the vertical lines 222. The data acquisition events 222 produce an image, after Fourier transform treatment of the data, to produce an image referred to as the IR_E1 image. Label 224 indicates that vertical lines 222 are referred to as a "spin echo (SE) readout #1". The image is referred to as being produced at time 226, although the image is acquired during the time interval represented by the vertical lines 222.

After a further waiting time TE2 230 another set of spin echo images are acquired by the MRI imaging scanner, as indicated by the vertical lines 232. Again, the sequence of spin echo readouts represented by the vertical lines 232 are used to generate an image, after Fourier transform treatment of the data, to produce a spin echo readout labeled as "SE-readout #2" 234. The image obtained through the spin echo readouts "SE-readout #2" 234 is referred to as the IR_E2 image, and it is referred to as being acquired at time 236. The IR_E2 image is degraded from the earlier IR_E1 image, mainly by transverse relaxation processes, as the waiting time TE2 230 is short in comparison with the transverse relaxation time T1.

Typical values in an exemplary embodiment of the invention for the various physical parameters discussed are listed in Table 1 below:

| Parameters MIX-TSE | Settings for brain scans |
| --- | --- |
| Geometry | |
| Field of view | 220 mm (rectangular 70%) |
| Matrix-FE direction | 256 |
| Matrix-PE direction | 143 |
| Imaging plane | Coronal |
| PE direction | Left-right |
| Slice thickness | 2.5 mm |
| Number of slices | 80 |
| Inter-slice gap | 0 mm |
| Contrast | |
| Flip angle: FA | 90° |
| First echo: TE1eff | 8 ms (centric profile order) |
| Second echo: TE2eff | 113 ms (linear profile order) |
| Turbo factor: TF | 18 (9 per echo) |
| Echo spacing: ES | 8 ms |
| Inversion time: invT | 700 ms |
| $TR_{SE}$ | 8721 ms |
| $TR_{IR}$ | 9421 ms |
| Other | |
| Scan time | 10:16 (minutes) |
| SAR | 3.1 Watts/kg |

In Table 1, the parameters are grouped according to separate categories that describe the main practical and technical aspects of the MIX-TSE pulse sequence used in this work. Abbreviations: SAR=specific absorption rate, FE=frequency encoding, PE=phase encoding, SS=slice select, TE1eff=first effective echo time, TE2eff=second effective echo time.

The time required to complete a complete scan is approximately 10 minutes. Power exposure to the patient is approximately 3.1 Watts/kilogram.

Observed values of longitudinal relaxation time T1 for tissue ranges from about 0.4 seconds to 1.8 seconds. Observed values of transverse relaxation time T2 for tissue range from about 0.02 seconds to 0.21 seconds, as given by Mansfield and Morris in their above mentioned book NMR Imaging in Biomedicine, at pages 17–24. However, the observed values depend upon the tissue, its state of health or disease, and the frequency of the proton resonance.

Returning now to FIG. 2A, additional image acquisition is shown beginning at time 250, and after waiting for the time period TR_SE 252 (in an exemplary embodiment of the invention TR_SE 252 is approximately 8.7 seconds). It is assumed that during the waiting period TR_SE 252 the patient's tissue loses all memory of the earlier pulse sequences beginning at time 210. A 90-degree RF pulse is applied to the patient's tissue at time 250. After a waiting time of TE1 254 an image is acquired at time 256, as shown by the vertical lines 258 indicating spin echo events, and label 260. Label 260 indicates that the image acquired at time 256 is referred to as the IR2_E1 image.

After an additional waiting time TE2 270 another image is acquired at time 272, as indicated by the vertical lines 274 indicating spin echo events. As shown by label 276, the image acquired at time 272 is referred to as the IR2_E2 image.

Another sequence of imaging events may then begin at time 280, after a waiting time of TR 282.

In an exemplary embodiment of the invention, TR 282 may be approximately 9.5 seconds.

The pulse sequence shown in FIG. 2A is used in this exemplary embodiment of the invention as it easily can be obtained with a Philips MRI Scanner (Gyroscan ACSNT, Philips Medical Systems, Shelton Conn.) and this scanner was used to obtain the data shown herein below.

The pulse sequence shown in FIG. 2A is referred to as the "MIX-TSE" pulse sequence, meaning that the pulse sequence produces a mix of a PD image, a T1 weighted image, a T2 weighted image, and a T1–T2 weighted image.

Figure 2B:
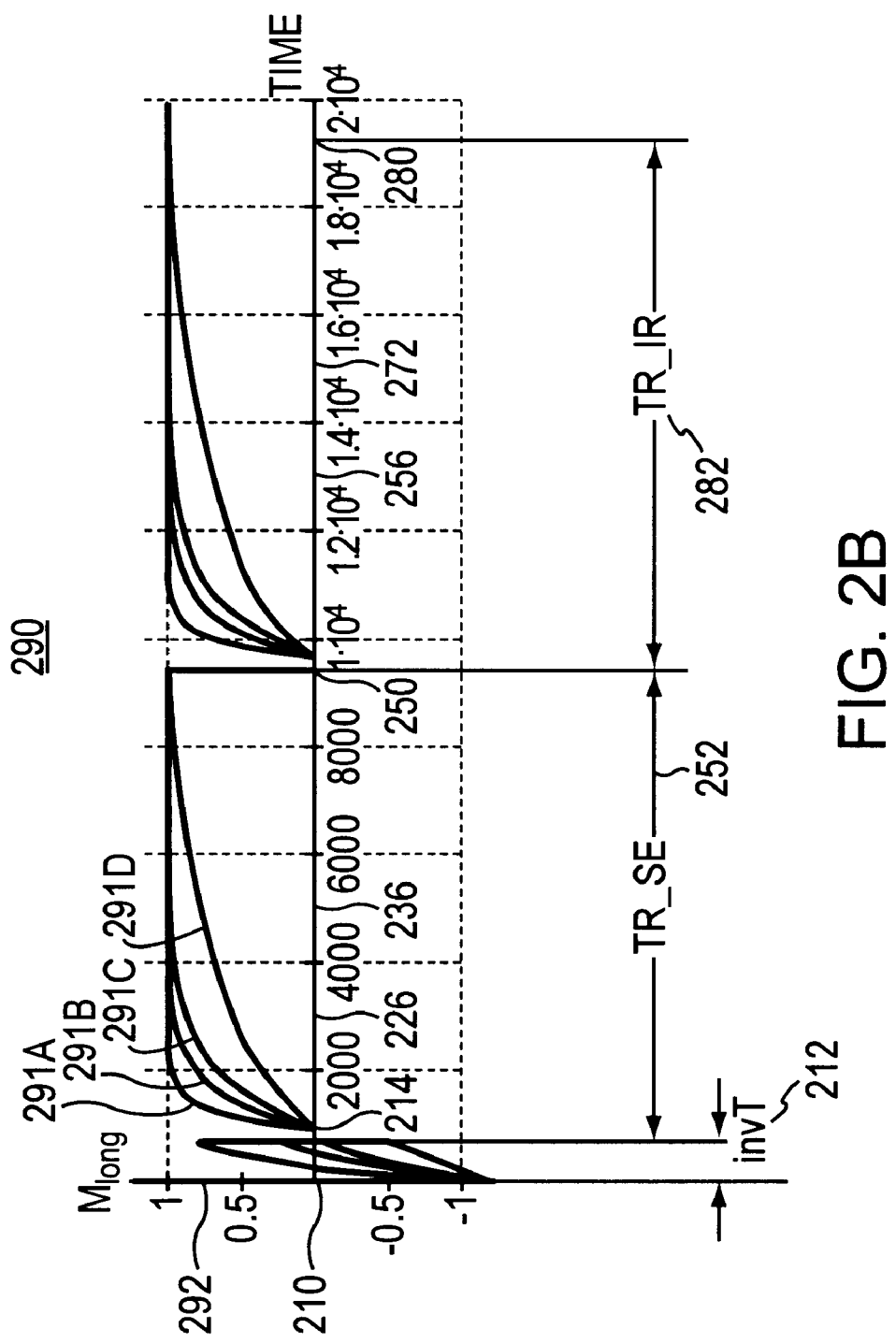
FIG. 2B is a graph showing the time dependence of longitudinal magnetization.

Turning now to FIG. 2B, the behavior of the longitudinal magnetization of the patient's tissue is shown by the graphs 290. Just before time 210 the magnetization of the patient's tissue is substantially parallel to the applied magnetic field B0 120, the longitudinal magnetization. The longitudinal magnetization is given the representative value of +1.0 at a time just before time 210.

At time 210 the 180-degree RF pulse is applied by scanner 100 to the patient's tissues. The value of the magnetization, plotted along the vertical axis 292, is driven from a value of +1.0 to a negative value of −1.0, as shown at time 210. This change in the patient's magnetization is brought about as a result of the spin axis of the protons in compounds in the patient's tissue being caused to precess, or rotate, by 180 degrees by the 180 degree RF pulse applied at time 210.

Curves for different values of longitudinal relaxation time T1 are shown, curve 291A has a small value of T1, curve 291B has a larger value of T1, curve 291C has a still larger value of T1, and curve 291D has the largest value of T1 shown in graphs 290. Each curve represents different tissue types, each tissue type having its characteristic value of longitudinal relaxation time T1. The smaller the value of T1, the faster the magnetization relaxes back to parallel to the applied magnetic field, and the larger the value of T1, the longer it takes the magnetization of the tissue to relax back to parallel to the applied magnetic field B0 120.

After a waiting time of invT a 90 degree RF pulse is applied at time 214. The longitudinal magnetization is driven to zero, as shown by the graphs, by the application of the 90-degree flip angle RF pulse. The longitudinal magnetization is driven to zero by the magnetization being re-oriented into the transverse plane. The magnetization begins to relax back from the transverse plane rapidly, "rapidly" because the transverse relaxation time T2 is normally much smaller than the longitudinal relaxation time T1.

During the waiting time TR_SE 252 the spin echo readouts at time 226 and time 236 are acquired, without affecting the longitudinal magnetization, as shown by the smooth nature of the graphs 291A–291C during this time span.

By time 250, after the waiting time TR_SE 252, the longitudinal magnetization has relaxed back so that the tissue with the slowest relaxation time (largest value of T1) has relaxed back to the value of +1.0, as shown by the graphs at time 250. The value of +1.0 indicates that all protons have regained a spin axis alignment parallel to the applied magnetic field B0 120.

At time 250 a second 90-degree RF pulse is applied to the patient's tissue by the scanner 100. Again, as at time 214, the longitudinal magnetization is driven to zero at time 250 as the magnetization rotates into the transverse plane. The longitudinal magnetization then begins to relax back to parallel to the applied magnetic field, so that by time 280 the tissue magnetization has relaxed back to a parallel orientation to the applied magnetic field B0 120. At time 256 and time 272 the spin echo image readouts are acquired, without substantially disturbing the longitudinal magnetization as is shown by the smooth nature of the longitudinal magnetization curves at these times.

ANALYSIS OF IMAGES

Theoretical Background

A quantity that decreases exponentially during time may be analyzed by use of the following equation:

$$Y(t) = Y(t=0) \exp\left[-\frac{t}{TC}\right] \qquad [\text{Eq. 1}]$$

Where the symbols have the meaning:
the variable t represents time;
Y(t) represents the value of a quantity Y at time t;
Y(t=0) represents the value of the quantity at the zero point of time, where t=0 is chosen for convenience;
exp is the exponential function;
TC is the time constant, and is the time for the quantity Y to decrease in value by an amount of 1/e.

An analysis to calculate TC from measured values of Y at time t=0 and at time t=TM, the measurement time, is given by rearranging equation 1 into the following equation:

$$TC = \ln[Y(t=0)/Y(t=TM)] \qquad [\text{Eq. 2}]$$

"ln" represents the natural logarithm.

The values of the longitudinal relaxation time T1 and the transverse relaxation time T2 are computed using an analysis similar to equation 2 at each voxel of a slice of patient tissue, as described in more detail hereinbelow. Each voxel of patient tissue is represented in an image as a pixel, and so from image data the computation is done at each pixel of the image.

Linear Combination of Source Images (LCSI)

A composite image is computed from the source images ($SI^m = 1, \ldots N$) acquired with the MRI scanner as:

$$LCSI\_PD_{(i,j)} = modulus\left[\sum_{m=1}^{N} a_m SI^m_{(i,j)}\right] \qquad [\text{Eq. 3}]$$

The modulus operation is used since the original source images generated by the scanner are complex-valued and N denotes the total number of acquired source images. The symbol LCSI stands for the Linear Combination of Source Images and the symbol $SI^M{}_{(i,j)}{}^m$ represents the pixel at position (i,j) of the $m^{th}$ source image acquired from a patient using a selected pulse sequence. The PD in the symbol LCSI_PD indicates that a proton density image is being computed. The symbols (i,j) stand for the calculation being performed at each pixel of the image, as the pixels are accessed by the integer coordinates "i" and "j". The symbols $a_m$ are coefficients of the linear combination, and are chosen to achieve a desired result in the composite image. For example, in an exemplary embodiment of the invention, the values of $a_m$ are chosen to maximize the signal-to-noise ratio in the composite proton density image.

In an exemplary embodiment of the invention, the sequence of pulses described through FIG. 2A are used to generate four (N=4) images, referred to as the IR1_E image 224, the IR1_E2 image 234, the IR2_E1 image 258, and the IR2_E2 image 276. With this notation Eq. 2 becomes:

$$LCSI\_PD_{(i,j)}=$$
$$=modulus[a_1\ IR2\_E1_{(i,j)}+a_2\ IR2\_E2_{(i,j)}+a_3\ IR1\_E1_{(i,j)}+a_4\ IR1\_E2_{(i,j)}] \quad [Eq\ 4]$$

Since by definition the LCSI operation is linear in the mathematical sense, the concept of performing weighted sums of source images for the generation of PD images is also applicable in the Fourier domain or k-space in which the primary MR image data kspace_SI$^m$ is acquired. The LCSI formula applicable to the primary k-space source images is:

$$LCSI\_PD_{(i,j)} = modulus\left[\sum_{m=1}^{N} a_m\ inv2DFT\{kspace\_SI_{(i,j)}^m\}\right] \quad [Eq.\ 5]$$

In this equation inv2DFT represents the inverse two-dimensional discrete Fourier transform operation applied to the primary unprocessed MR image data (kspace_SI$^m$) for $m^{th}$ source image in k-space. Furthermore, the LCSI algorithm can also be applied to any of the intermediate states of the image data, for example the hybrid k-space-image space data state inv1DFT {kspace_SI$^m$} that results from a one-dimensional inverse Fourier transform. In this case, the LCSI formula is:

$$LCSI\_PD_{(i,j)} = modulus\left[\sum_{m=1}^{N} a_m\ inv1DFT\{inv1DFT\{kspace\_SI_{(i,j)}^m\}\}\right] \quad [Eq.\ 6]$$

The next step in the definition of operative LCSI algorithms is to define specific criteria for adjusting the linear combination coefficients $a_m$ with the purpose of generating images that are realistic approximations to the true PD spatial distribution inside the patient and that at the same time have superior image quality relative to prior art.

Selection of LCSI Coefficients: Important LCSI Algorithms

Two examples of LCSI algorithms each of which is characterized by a specific set of linear combination coefficient values $\{a_m: m=1, \ldots, 4\}$ are of particular practical importance; the first algorithm for its overall computational simplicity—hereafter referred to, as LCSI-basic algorithm—and the second, hereafter referred to, as LCSI-maximum-SNR algorithm because it makes efficient use of the SNR contained in all the source images acquired per slice. Since SNR can be traded for higher spatial resolution, this second algorithm is useful for clinical applications in which the use of higher spatial resolution scans are of diagnostic value.

In the following, these LCSI algorithms are discussed as exemplary embodiments of the invention.

With the LCSI-basic algorithm, a quantitative PD image is generated simply by rescaling one source image per slice, specifically that source image the acquisition parameters of which are closest to the acquisition parameters of an ideal and exact PD image specifically TE=0, TR=infinite, FA=90°, and single slice acquisition. With the MIX-TSE pulse sequence parameters used in an exemplary embodiment of the invention (see Table 1), the image generated in the third TSE acquisition, that is the first echo of the second IR period (IR2_E1, image 260 of FIG. 2A) is a close approximation to an exact PD image, except for a proportionality normalization factor ($\Gamma$) the specific value of which is chosen such that the pixel values of regions containing simple fluids (e.g. CSF, synovial fluid, etc.) are numerically equal to unity. Accordingly, the linear combination coefficients for this most basic LCSI algorithm are simply $\{a_1=\Gamma, a_2=a_3=a_4=0\}$.

Although the LCSI-basic algorithm is very simple to implement, the generated PD images contain information of only one of the source images and therefore this algorithm is SNR inefficient. The question arises as to whether some fraction of the SNR that is contained in the other source images that is IR2_E2 image 276, IR1_E1 image 224, and IR1_E2 image 234 can be added constructively to improve the base level SNR provided by the IR2_E1 image 260 image alone, while preserving or perhaps improving the PD weighted quality of the generated image. Mathematically this problem is equivalent to defining a criterion for adjusting the weighting coefficients so that the relative T1- and T2-weightings of the other three source images IR2_E2 image 276, IR1_E1 image 224, and IR1_E2 image 234 balances upon LCSI addition thus generating a faithful approximation to a PD image and that has a higher SNR than the IR2_E1 image 260 image alone. Because the second echoes of the two IR acquisitions are in the same exponential relation to their respective first echoes (i.e. same echo time TE2, see FIG. 2A), a single parameter ($\xi_{T2}$) can be used to control the level of T2 contrast in the LCSI image. Furthermore, another single parameter ($\xi_{T1}$) may be used to control the relative contribution of the two images obtained with the two echoes of the IR1 period since these two images have the same level of T1-weighting relative to the images acquired in the IR2 period. From these considerations a two parameter ($\xi_{T1}$ and $\xi_{T2}$) LCSI formula, specifically:

$$LCSI\_PD_{(i,j)}=$$
$$=modulus\ [IR2\_E1_{(i,j)}+\xi_{T2}\ IR2\_E2_{(i,j)}+\xi_{T1}\ (IR1\_E1_{(i,j)}+\xi_{T2}\ IR1\_E2_{(i,j)})] \quad [Eq.\ 7]$$

is used as an exemplary embodiment of the invention for the generation of the maximum-SNR PD images for the purpose of virtual MRI scanning.

LCSI Maximum-SNR Algorithm: Coefficient Optimization Procedure

As can be expected, the specific optimum values for ($\xi_{T1}$) and for ($\xi_{T2}$) depend on the experimental conditions used for image acquisition. Ranges for these optimum values can be established by means of the following multi step optimization procedure, the purpose of which is to attempt reverting the relaxation time weightings of {IR2_E2, IR1_E1, IR1_E2} and then average the resulting three images with IR2_E1. First, as a zero order approximation, the formulas describing the relaxation time weightings of the four images produced by the MIX-TSE pulse sequence can be used to approximately revert the relaxation time weightings of these. Because the MIX-TSE pulse sequence was implemented with very long TR$_{IR}$ and TR$_{SE}$ values (see Table 1) these relaxation time inversion factors are to a very good approximation given by the following equations:

$$\xi_{TI}^{(0)} = \frac{1 - 2\exp[-TI/TI^{(0)}]}{1 - \exp[-(TR_{SE} - TSE_{shot})/TI^{(0)}]} \exp[i\pi] \text{ and,} \quad [\text{Eq. 8}]$$

$$\xi_{T2}^{(0)} = \exp[-(TE2 - TE1)/T2^{(0)}]\exp[i\pi] \quad [\text{Eq. 9}]$$

In these equations the complex-valued phase factor represent the 180° out of phase relation between first and second echoes as well as between the IR2_E1 image in relation to the IR1_E1 image. Furthermore, the relaxation times $T1^{(0)}$ and $T2^{(0)}$ represent a non-specific "median tissue" with intermediate relaxation times within the biologic spectrum. To zero order approximation, by using the values $T1^{(0)}=800$ msec and $T2^{(0)}=100$ msec, the following values are produced by equations [7] and [8] respectively: $\xi_{T1}^{(0)}=-0.166$ and $\xi_{T2}^{(0)}=-0.350$. With these values as starting point, the second step consists in calculating the numerical differences between maximum-SNR images generated with equation [6] and the IR2_E1 image and determine the ranges of $(\xi_{T1})$ and $(\xi_{T2})$ values that minimize these differences. The results of such a procedure (column labeled |ΔPD1| in Table 2), which were performed with brain images, show that differences of less than 10% between normalized maximum-SNR LCSI images and normalized IR2_E1 images can be obtained throughout the imaging plane for the following ranges: $-0.204 \leq \xi_{T1} \leq -0.097$ and $-0.122 \leq \xi_{T2} \leq -0.385$. Furthermore, in these ranges the SNR improvements were approximately from 40% to up to 80%. Finally, an approximate absolute minimum for |ΔPD1| was found for $\xi_{T1}^{(Opt)}=-0.148$ and $\xi_{T1}^{(0)}=-0.223$. These values produce accurate results in the brain as well as in phantom imaging experiments.

TABLE 2

LCSI-maximum-SNR algorithm

| Median-T1 msec | Median-T2 msec | $\xi_{T1}$ | $\xi_{T2}$ | SNR$^{\text{max-SNR}}$ | $\frac{\text{SNR}^{\text{max-SNR}}}{\text{SNR}^{\text{IR2\_E1}}}$ | \|ΔPD1\| Max % | \|ΔPD2\| Max % |
|---|---|---|---|---|---|---|---|
| 760 | 90  | −0.204 | −0.311 | 49.073 | 1.778 | 10.506 | 112.834 |
| 780 | 90  | −0.185 | −0.311 | 48.472 | 1.756 | 9.911  |         |
| 800 | 90  | −0.166 | −0.311 | 47.86  | 1.734 | 9.382  |         |
| 820 | 90  | −0.148 | −0.311 | 47.251 | 1.712 | 8.902  |         |
| 840 | 90  | −0.131 | −0.311 | 46.655 | 1.69  | 9.044  |         |
| 860 | 90  | −0.114 | −0.311 | 46.068 | 1.669 | 9.536  |         |
| 880 | 90  | −0.097 | −0.311 | 45.499 | 1.649 | 10.241 |         |
| 820 | 40  | −0.148 | −0.072 | 35.533 | 1.287 | 13.581 |         |
| 820 | 50  | −0.148 | −0.122 | 37.817 | 1.370 | 10.324 |         |
| 820 | 60  | −0.148 | −0.174 | 40.296 | 1.46  | 8.46   |         |
| 820 | 70  | −0.148 | −0.223 | 42.756 | 1.549 | 8.256  |         |
| 820 | 80  | −0.148 | −0.269 | 45.094 | 1.634 | 8.522  |         |
| 820 | 90  | −0.148 | −0.311 | 47.251 | 1.712 | 8.902  |         |
| 820 | 100 | −0.148 | −0.350 | 49.182 | 1.782 | 9.902  |         |
| 820 | 110 | −0.148 | −0.385 | 50.902 | 1.844 | 11.187 |         |
| 820 | 120 | −0.148 | −0.417 | 52.451 | 1.9   | 12.580 |         |

A parameter optimization procedure for LCSI-maximum-SNR algorithm is given in Table 2. Reference SNR (IR2_E1)=27.6

Model-conforming Q-MRI Algorithms

The most common artifacts in synthetic MR images, such as pixel dropouts and the artificial delineation of some tissue interfaces are caused by errors that can occur in the generation of T1 and T2 Q-MRI images. These undesirable effects are most pronounced at locations where the physical model that is assumed in the Q-MRI algorithm is not applicable, for example pixels representing tissues or materials that do not generate MR signal, for example cortical bone and air out pixels. Particularly, artifacts are present for pixels representing an admixture of partial-volumed tissues with different relaxation properties.

In order to reduce these artifacts, model-conforming Q-MRI algorithms have been developed, with which quantitative image data is calculated with the known MR physics formulas solely for the pixels representing tissues that conform to the physics model assumed in the Q-MRI algorithm, while for those pixels that do not conform with the model, a predefined fixed value is assigned. Accordingly, with model-conforming Q-MRI algorithms, the pixels that are most problematic and which tend to cause the majority of pixel dropout artifacts, are processed differently.

As discussed in the following, the principle underpinning model-conforming Q-MRI algorithms is very general and may be applied for the generation of Q-MRI images of any tissue property (generically symbolized by tp) that influences NMR relaxation in that tissue. The defining formula for a general model-conforming Q-MRI algorithm that uses as input any number of the source images $\{SI^m, m=1, \ldots N\}$ for calculating the value of a generic tissue property tp, evaluated at a pixel with coordinates (i,j), can be written in the form of a conditionally-branched set of formulas, with the following structure:

$$\{SI_{(i,j)}^m\} \xrightarrow{\text{Model-conforming algorithm}} tp_{(i,j)} = \quad [\text{Eq. 10}]$$

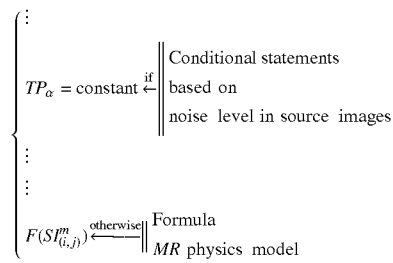

This formula, which is evaluated on a pixel-by-pixel basis, Starts with a number of conditional statements whereby the value of the tissue property is assigned to a predefined constant value $TP_\alpha$ based on the values of the input source images at that specific pixel and in relation to the noise level of the source images that were used as input for the model-conforming algorithm. The symbol alpha $\alpha$ is an integer that enumerates the number of the predefined constant used in the algorithm.

Exemplary embodiments of this invention, as applied to the calculation of T1- and T2-Q-MR images, using as input the source images IR1__E1 image 224 IR1__E2 image 234 IR2__E1 image 260, and IR2__E2 image 276 that were acquired with the MIX-TSE pulse sequence discussed above, are described next.

A model-conforming Q-MRI algorithm used for the generation of T1 quantitative images consists of the following operations:

$$T1_{(i,j)} = \qquad \text{[Eq. 11]}$$

$$\begin{cases} 0 \overset{if}{\leftarrow} \left\| \begin{array}{l} |IR2\_E1_{(i,j)}| \leq \text{noise} \\ \text{and} \\ \||IR1\_E1_{(i,j)}|-|IR2\_E1_{(i,j)}|\| \leq \text{noise} \end{array} \right. \\ \dfrac{T1}{\ln\left[\frac{1}{2}\left(1-\dfrac{IR1\_E1_{(i,j)}}{IR2\_E1_{(i,j)}}\right)\right]} \overset{\text{otherwise}}{\longleftarrow} \left\| \begin{array}{l} \text{For pixels } (i,j) \text{ where} \\ \text{physics model is valid} \end{array} \right. \end{cases}$$

In this formula, invT is the inversion time of the MIX-TSE pulse sequence that was used for acquisition of the source images (see Table 1).

With this exemplary embodiment of a T1 model-conforming algorithm, the condition that is used for selecting pixels that do not conform with the simple physics model of T1 inversion recovery following a 180-degrees inversion pulse, is based on identifying those pixels where no measurable signal change is measured at the two different recovery times (i.e. $\||IR2\_E1_{(i,j)}|-|IR1\_E1_{(i,j)}|\| \leq$ noise and that also have an overall signal that is below noise level ($|IR^2\_E1_{(i,j)}| \leq$ noise). Furthermore, for model-conforming pixels, the T1 values are computed by the simple inversion recovery ratio model as applied to the MIX-TSE pulse sequence, which is $$T1_{(i,j)} = T1 \Big/ \ln\left[\frac{1}{2}\left(1-\frac{IR1\_E1_{(i,j)}}{IR2\_E1_{(i,j)}}\right)\right],$$

while for pixels that do not conform to this model, a value of zero corresponding to an MR-inactive tissue, is assumed.

Next, a model-conforming Q-MRI algorithm used for the generation of T2 quantitative images is presented. The following embodiment of a model-conforming Q-MRI algorithm for the tissue property T2 uses two source images as input, specifically IR2__E1 image 260, and IR2__E2 image 276, which represent two consecutive measurements at times TE1eff and TE2eff respectively (see Table 1) during the T2 decay of the tissue signals.

$$T2_{(i,j)} = \begin{cases} 0 \overset{if}{\leftarrow} |IR2\_E1_{(i,j)}| \leq \text{noise} & \text{[Eq. 12]} \\ 0 \overset{if}{\leftarrow} |IR2\_E2_{(i,j)}| = 0 \\ T2_{water} \overset{if}{\leftarrow} \||IR1\_E1_{(i,j)}|-|IR2\_E1_{(i,j)}|\| \leq \text{noise}/4 \\ \dfrac{TE2eff - TE1eff}{\ln\left[\dfrac{IR2\_E1_{(i,j)}}{IR2\_E2_{(i,j)}}\right]} \overset{\text{otherwise}}{\longleftarrow} \left\| \begin{array}{l} \text{For pixels } (i,j) \text{ where} \\ \text{physics model is valid} \end{array} \right. \end{cases}$$

This algorithm starts with three conditional steps that are used to identify the non-conforming pixels according to the following criteria. A T2 value of zero corresponding to MR-inactive tissues (e.g. cortical bone, air, etc.) is assigned to all pixels were signal in image IR2__E1 image 260 is less than the noise and also were the signal of the second echo (IR2__E2 image 276) is identical to zero. Furthermore, in the third conditional step, pixels that do not exhibit a measurable T2 decay are assigned the highest possible T2 value, specifically that of pure water $T2_{water}$=2100 ms. In the fourth and final step of this exemplary embodiment of a model-conforming algorithm, the T2 values for the remaining model-conforming pixels are computed with a standard mono-exponential model for T2 decay, as above discussed in the "Theoretic background" section of this chapter.

When tested experimentally with a phantom and in the human brain significant image quality improvements are observed, with respect to background noise and geometrical definition of small or thin structures can be obtained by implementing model-conforming criteria to otherwise standard Q-MRI algorithms. The model conforming images for T1 and T2 were calculated with the following variants of Eq. 10: Also quantitative accuracy possible with these two model-conforming Q-MRI algorithms was assessed by means experiments with a phantom with known geometry and relaxation times.

Virtual MRI Scanning Phase

As comprehensive as an MRI examination may be in terms of the specific number of individual tissue property weightings used for scanning, relying exclusively on fixed-intrinsic-contrast images for the assessment of disease by MR imaging is not ideal primarily because the full intrinsic contrast dynamic range (CDR) of any of the weighting tissue properties (e.g. T1, T2, T2*, state of motion, etc.) that can be explored with MRI, is not necessarily intuitive to the observer a priori. In other words, because only a discrete number of image contrast types are used in the detection and the characterization of pathologic entities that in general can have unpredictable values of the weighting tissue properties, the maximum possible sensitivity and specificity of the MRI examination might not be achieved. Pathologic entities with a higher probability of failed detection or characterization with fixed contrast MR imaging are small sub-voxel size pathologic structures the contrast of which can be diminished by partial volume averaging, as well as larger structures exhibiting proton density and relaxation times similar in value to that of the surrounding tissues. Of diagnostic importance is the visualization of entities that can alter patient management, for example subtle tumor invasions to adjacent tissue layers and the detection of focal pathology when surrounded by diffuse pathology.

For such applications where the diagnostic information may be contained in a narrow contrast range and therefore may not be revealed with fixed-intrinsic-contrast acquisitions, the development of MR imaging techniques of the present invention for exploring of the full CDR of the relevant tissues increases the diagnostic power (sensitivity and specificity) of MR imaging.

One approach that could be instrumental for extracting and for visualizing the full CDR that is latent in a physically acquired MR image set can be found in methods stemming from an intricate and multi-procedural MR imaging concept, which has been referred to by some authors, generically and as a whole, as MR image synthesis. Imaging techniques embodying the MR image synthesis concept allow for the continuous and on-demand generation of images with computer-synthesized MR contrast. This can be done subsequently to having physically scanned the patient by means of specialized (physical) MRI pulse sequences and most importantly, this image synthesis phase can be performed post facto in the patient's absence by means of a computer program. Based on its function, this computational phase that embodies the laws of MR imaging physics may be appropriately referred to as virtual MRI scanning. The present invention gives much improved virtual MRI scanning.

For every pixel (i,j), analytic PD generation algorithms can be represented symbolically by the general formula:

$$\text{Analytic\_PD}_{(i,j)} = \frac{SI_{(i,j)}^m}{PSw[\{TE, TR, FA, \ldots\}_m; \{T1_{(i,j)}, T2_{(i,j)}, \ldots\}]} \quad \text{[Eq. 13]}$$

In this formula, $PSw[\{TE, TR, FA, \ldots\}_m; \{T1_{(i,j)}, T2_{(i,j)}, \ldots\}]$ is the MR theory-derived pulse sequence weighting function evaluated at the pulse sequence settings $\{TE, TR, FA, \ldots\}_m$ used to acquire the $m^{th}$ source image $SI_{(i,j)}^m$ and also evaluated at the relaxation times $\{T1_{(i,j)}, T2_{(i,j)}, \ldots\}$ that were generated by Q-MRI methods and therefore are not error free. Analytic extrapolation algorithms in this category have been used in one form or another in all previous physical-virtual MRI investigations, mostly using pulse sequence weighting functions that model the MR signal of conventional pulse sequences such as spin-echo and gradient-echo sequences. Analytic extrapolation algorithms are not ideal because these recycle imperfect image information $\{T1_{(i,j)}, T2_{(i,j)}, \ldots\}$ that is incomplete as a consequence of irreversible information losses that occurred in prior or intermediate Q-MRI computational steps. For example, those steps that were used first to generate the input T1 and T2 data use data having experimental uncertainties. Therefore, when analytically extrapolated quantitative PD images are used as the base level image set, or equivalently as the virtual patient with the purpose of virtual MRI scanning, synthetic images with reduced SNR and increased artifact appearance (e.g. pixel dropouts) can result.

In order to avoid these undesirable effects on synthetic image quality as generated by previously studied physical-virtual MRI scanning methods, the present inventive method was developed.

Contrast series of synthetic MR images with selected levels of T1 and T2 weightings, and with a consistently high image quality level, are produced by using PD images generated by means of any of the LCSI algorithms described above. These series of synthetic images are generated by means of contrast synthesis algorithms or virtual MRI pulse sequences, which are based on the laws of magnetization-dynamics physics (e.g. Bloch-Torrey theory: a) Bloch F. Nuclear induction. Phys. Rev. 70:46–74, 1946 is and b) Torrey HC. Bloch equations with diffusion terms. Phys. Rev. 104(3):563–5, 1956.)

The general formula for the generation of synthetic images Synthetic_$I_{(i,j)}$ with any given virtual MRI pulse sequence that is represented by a specific pulse sequence-weighting factor PSw is:

$$\text{Synthetic\_}I_{(i,j)} = LCSI\_PD_{(i,j)} \cdot PSw[\{TE, TR, FA, \ldots\}_m; \{T1_{(i,j)}, T2_{(i,j)}, \ldots\}] \quad \text{[Eq. 14]}$$

Depending on the specific form of the pulse sequence-weighting factor, the formula above can be used to generate synthetic images simulating currently achievable imaging conditions as well as conditions that cannot be implemented currently due to technological and/or physical limitations. Important examples of currently achievable imaging conditions include scanning with the conventional spin-echo (CSE) pulse sequence, which is represented by the following pulse sequence weighting function:

$$PSw[\{TE, TR, FA, \ldots\}_m; \{T1_{(i,j)}, T2_{(i,j)}, \ldots\}] = \quad \text{[Eq. 15]}$$

$$= \sin(FA)\exp\left[-\frac{TE}{T2_{(i,j)}}\right]\left\{\frac{1-\exp\left[-\frac{TR}{T1_{(i,j)}}\right]}{1-\cos(FA)\exp\left[-\frac{TR}{T1_{(i,j)}}\right]}\right\}$$

Also of practical importance is imaging with the inversion recovery conventional spin-echo (IR-CSE) pulse sequence that is represented by:

$$PSw[\{TE, TR, FA, \ldots\}_m; \{T1_{(i,j)}, T2_{(i,j)}, \ldots\}] = \quad \text{[Eq. 16]}$$

$$= \sin(FA)\exp\left[-\frac{TE}{T2_{(i,j)}}\right]\left[1-2\exp\left[-\frac{TI}{T2_{(i,j)}}\right]+\exp\left[-\frac{TR}{T1_{(i,j)}}\right]\right]$$

Among the scanning conditions that are not currently achievable by means of physical MRI scanning and that could be of practical importance are:

1) The possibility of applying repeatedly virtual inversion recovery pulse sequences with different inversion times each chosen to null the signal from a different tissue. In this way nullifying successively all other tissues may be used as a method for segmentation of any selected tissue. Theoretically, such a sequential segmentation process may be used for extracting the full CDR latent in the source images extracted by virtual MRI scanning.

2) The generation of nonstandard contrast weightings such as simulated "T1-decay" by replacing T2$_{(i,j)}$ by T1$_{(i,j)}$ in equations 12, 13, or 14 above, and simulated "sum T1+T2" contrast again by replacing. T2$_{(i,j)}$ by T1$_{(i,j)}$+T2$_{(i,j)}$ in equations 12, 13, or 14.

Flow Diagram of the Invention

Referring again to FIG. 3, a flow diagram 300 is shown. At block 302 the physical scan is performed to produce four (4) source images, the IR1_E1 image 224, the IR1_E2 image 234, the IR2_E1 image 258, and the IR2_E2 image 276. From block 302 the process goes to both block 304 and block 310.

At block 304, the linear combination of images calculation for a proton density image is performed. For example, the linear combination of images, which generates the maximum signal to noise ratio image, may be utilized. Alternatively, other linear combinations of images may be utilized to produce desired results. After completing block 304 the calculational procedure goes to block 306.

At block 306, the quantitative proton density image is computed, for example, using equation 7, in combination with equation 8 and equation 9 to calculate the linear combination coefficients. After completing the calculations of block 306, the calculational procedure goes to block 308.

At block 308 the calculational procedure uses the result of Block 306 and the results of the calculation using blocks 310 and 312, in order to compute a desired simulated Magnetic Residence Image Pulse Sequence.

Returning now to block 302, following the acquisition of the source images, the calculational procedure goes to block 310, in addition to the previously described calculation at block 304.

At block 310 the model-conforming Q_MRI methods are used utilizing the above-mentioned equations. Following the calculation of bock 310, the calculational procedure goes to block 312.

At block 312, the Q_MR images are used to compute the weighting tissue properties such as longitudinal relaxation time T1, transverse relaxation time T2, and possibly other tissue properties of interest. For example, in an exemplary embodiment of the invention, the longitudinal relaxation time T1 is computed at each pixel using Equation 11. Also, the transverse relaxation time T2 is computed at each pixel using equation 12.

Returning to block 308, the quantitative proton density image along with the tissue properties such as the longitudinal relaxation time T1 and the transverse relaxation time T2 are used to compute simulated MR imaging pulse sequences. Following the computation of block 308 the calculational procedure goes to block 302, at which the contrast image is computed. The contrast image is then presented on a computer screen for observation by a physician, is printed photographically or by a computer printer, etc.

Prior Art

Figure 4:
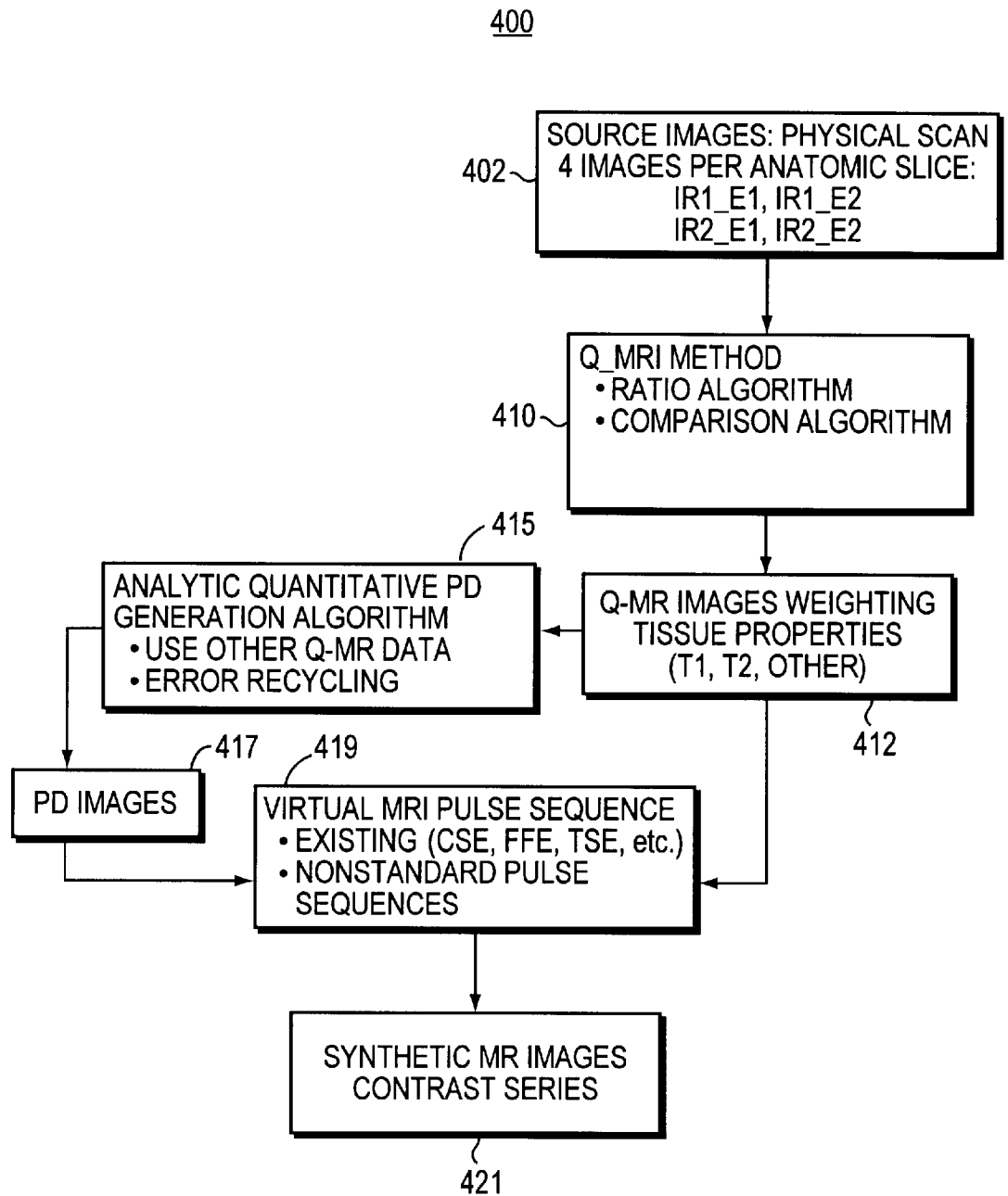
FIG. 4 is a flow chart illustrating the prior art.

Turning now to FIG. 4 a calculational scheme 400 of the prior art is shown. At block 402 the four (4) source images are obtained as at block 302. From block 402 the calculational procedure goes to block 410.

At block 410 the calculations done at block 310 are performed. Following the calculations of block 410 the calculational procedure goes to block 412. At block 412 the calculations preformed at block 312 are performed. Following the calculations at block 412 the calculational procedure goes to block 415 and to block 419.

At block 415 a proton density image is computed using the output of the Q_MR image calculation of block 412. Following the calculation of block 415, the calculational procedure goes to block 417 where a proton density image is computed. Following the calculation of block 417 the calculational procedure goes to block 419.

At block 419 a virtual MR imaging pulse sequence is computed in response to the results computed at block 412 and at block 417. Following the calculation at block 419, the calculational procedure goes to block 421.

At block 421 a synthetic MR image is presented on a computer screen for observation by a physician, is printed photographically or by a computer printer, etc.

Figure 3:
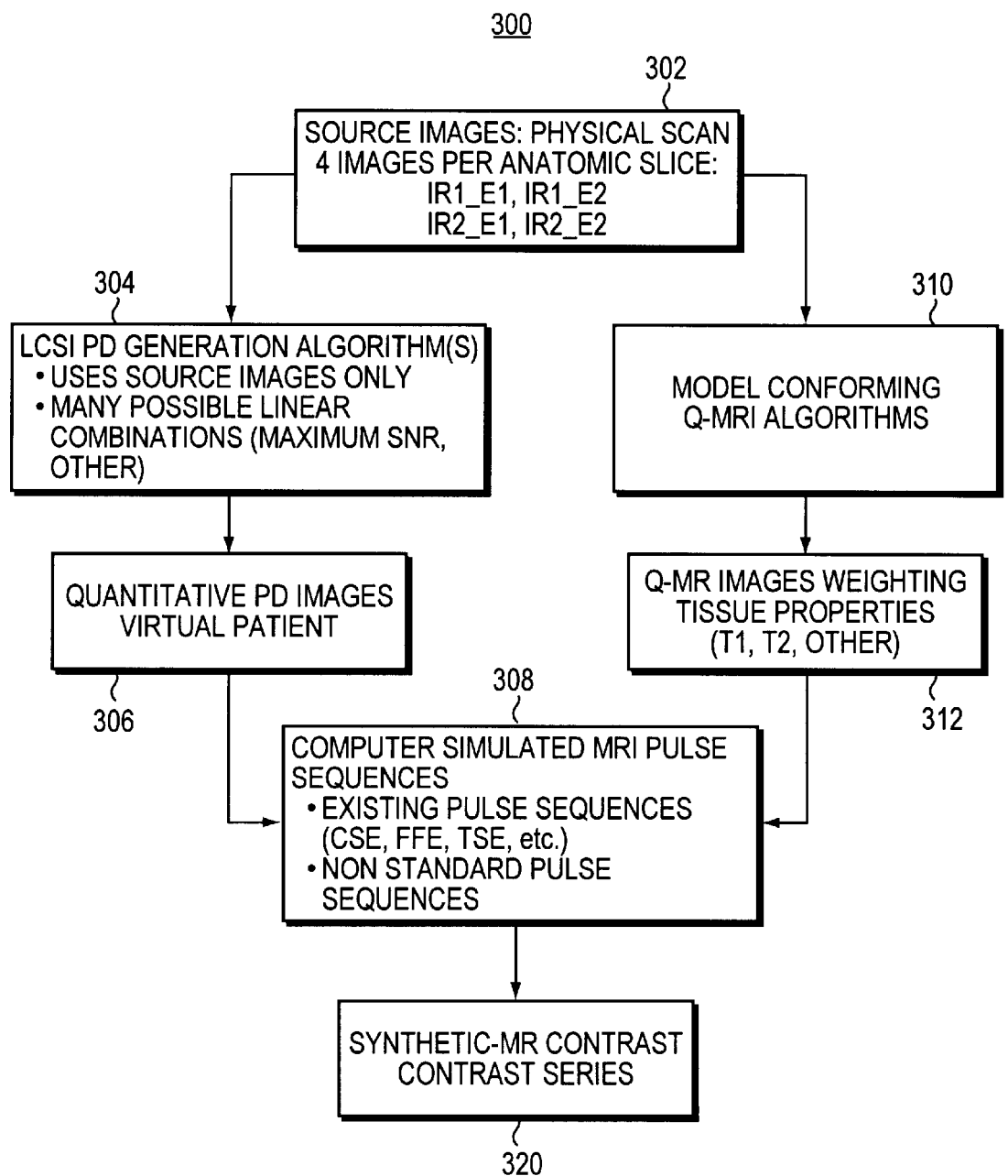
FIG. 3 is a flow chart in accordance with the invention.

The difference between the prior art calculation of FIG. 4 and the inventive calculation of FIG. 3 is shown by the use of the linear combination of scanned images at block 304 and block 306 in order to generate the quantitative proton density image. Use of the linear combination of scanned images method produces a proton density image with less noise than does the prior art method. This better proton density image permits calculation of an improved synthetic MR image at block 320.

Example Images

Turning now to FIG. 5, FIG. 6, FIG. 7, and FIG. 8, the four (4) source images taken by the pulse sequence shown in FIG. 2A, and acquired in the calculational procedure of FIG. 3 at 302 or acquired by the calculational procedure of FIG. 4 at block 402 are shown.

Figure 5:
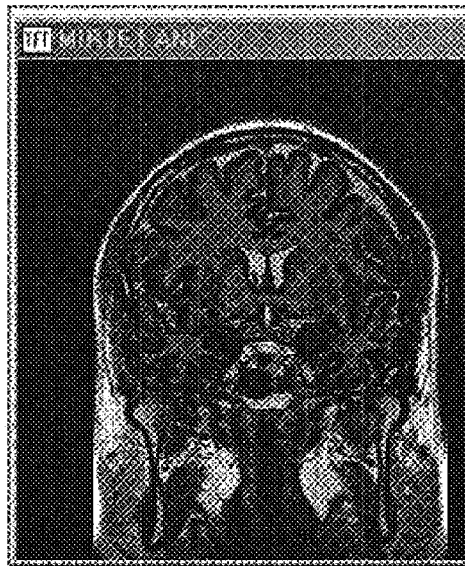
FIG. 5 is an IR_E1 source image, T1 weighted.

FIG. 5 shows the image taken at time 226, the IR1_E1 image, which is regarded as the T1 weighted image.

Figure 6:
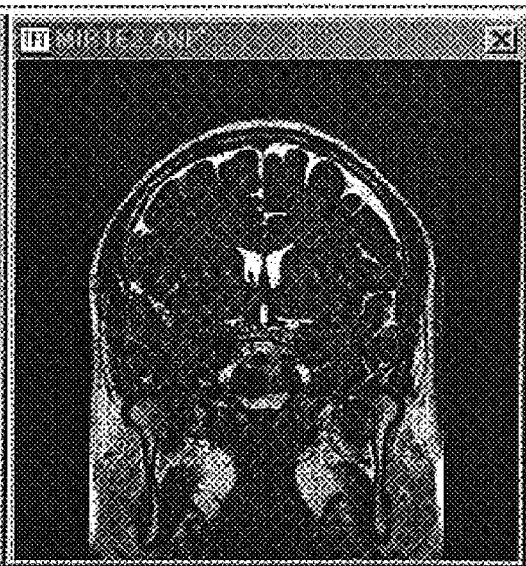
FIG. 6 is an IR1_E2 source image, T1&T2 weighted.

At FIG. 6 the image taken at time 236, the IR1_E2 image, is shown. The IR1_E2 image is the T1&T2 weighted image.

Figure 7:
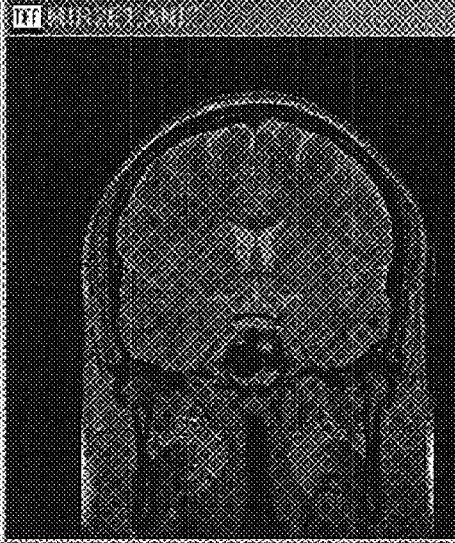
FIG. 7 is an IR1_E1 source image, PD weighted.

FIG. 7 shows the image taken at time 256 and is the IR2_E1 image, and is the proton density weighted, or PD-weighted image.

Figure 8:
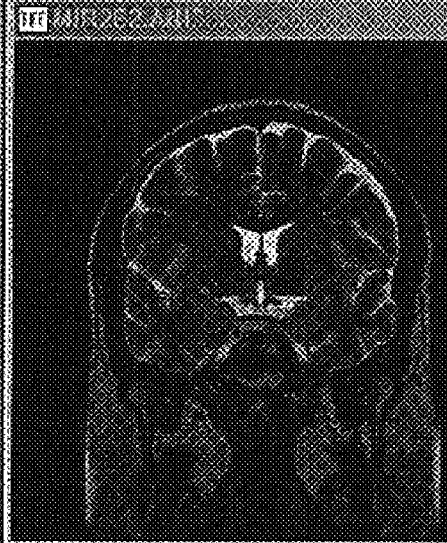
FIG. 8 is an IR2_E2 source image, T2 weighted.

FIG. 8 shows the image taken at time 272 and is the IR2_E2 image. The IR2_E2 image is the image referred to as the proton density and T2 weighted image, PD&T2 weighted image.

During acquisition of the images, such as the images of FIG. 5, FIG. 6, FIG. 7, and FIG. 8, a sequence of slices is taken throughout the patient's body, the patient's head in the example. These slices can be reconstructed along different planes to show regions of interest in the patient's brain.

Figures 9, 10:
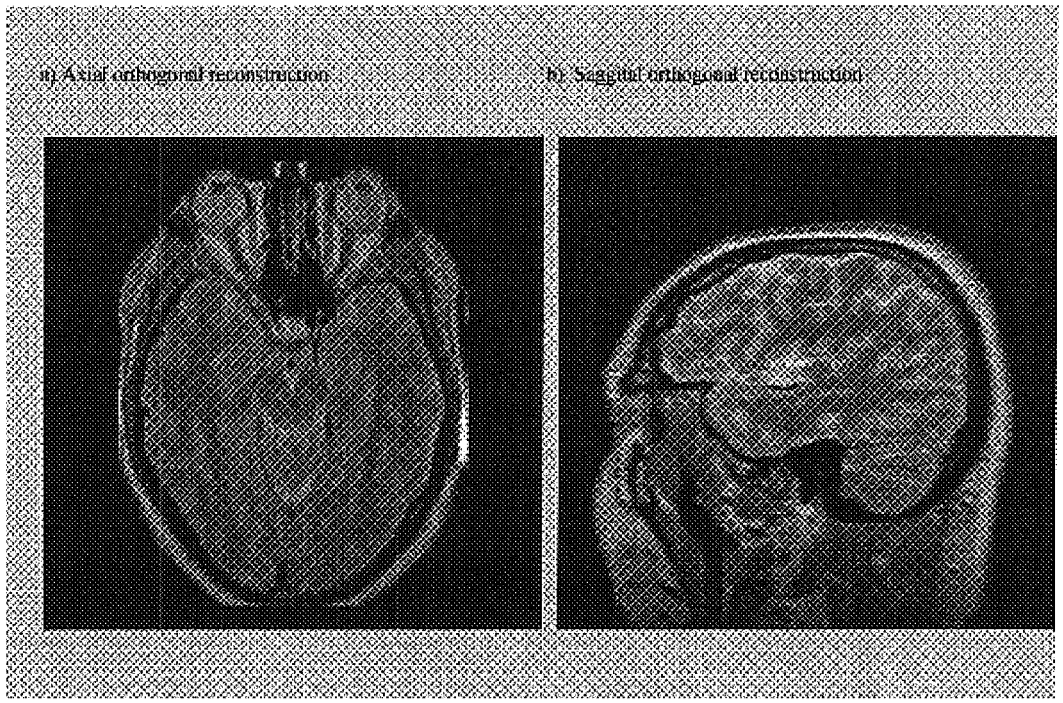
FIG. 9 is a synthetic image, an axial orthogonal reconstruction.
FIG. 10 is a synthetic image, a saggital orthogonal reconstruction.
Figures 11A, 11B, 11C, 11D, 11E, 11F, 11G, 11H:
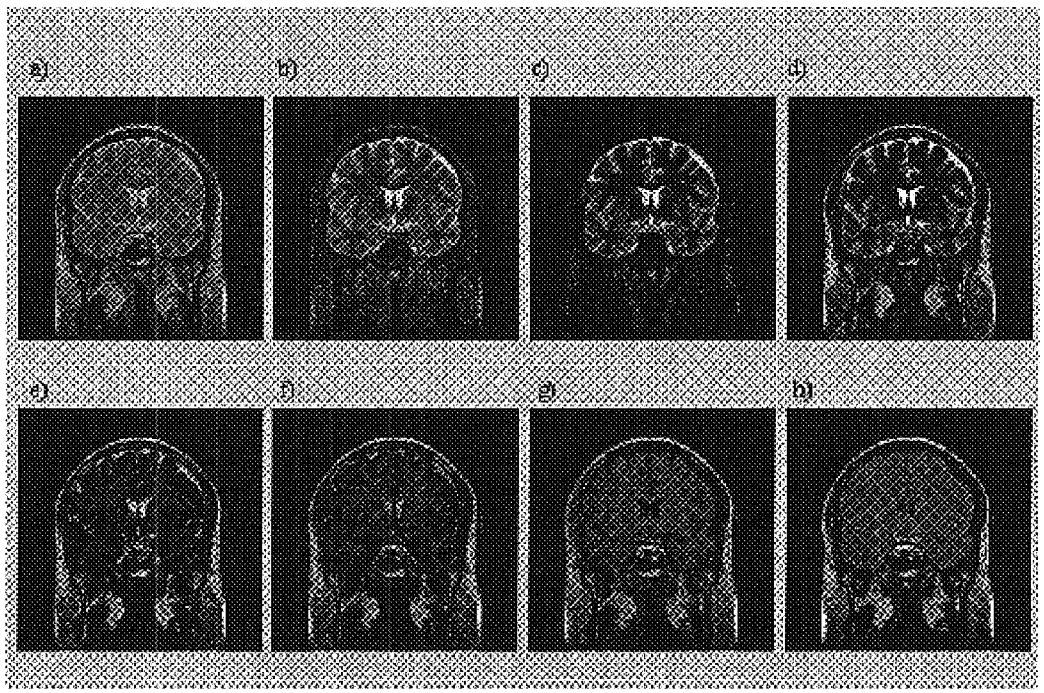
FIG. 11A–FIG. 11H is a sequence of synthetic images for varying values of longitudinal waiting time; and, FIG. 12A

Turning now to FIG. 9, an axial orthogonal reconstruction at the mid level of the patient's brain, and showing the eyes is shown. The image of FIG. 9 is reconstructed using the inventive calculational procedure shown in FIG. 4 and described with reference to the equation 3 through equation 15.

Turning now to FIG. 10, a sagittal orthogonal reconstruction showing the patient's brain as computed using the inventive calculational procedure of FIG. 3 is shown.

Turning now to FIG. 11A–FIG. 11H, a sequence of synthetic images of the brain are shown. The images are obtained by using the relaxation times T1 and T2 along with the proton density image computed using the inventive calculational procedure of FIG. 3. The sequence in FIG. 11A–FIG. 11H shows the effect of changing the inversion waiting time invT 212 on the reconstruction process. The synthetic images of FIG. 11A–FIG. 11H are shown as follows: at FIG. 11A the inversion waiting time 212 is taken as 0. At FIG. 11B the inversion waiting time 212 is taken as 150 milliseconds. At FIG. 11C the inversion waiting time 212 is taken as 300 milliseconds. At FIG. 11D the inversion waiting time 212 is taken as 450 milliseconds. At FIG. 11E the inversion waiting time 212 is taken as 600 milliseconds. At FIG. 11F the inversion waiting time 212 is taken as 750 milliseconds. At FIG. 11G the inversion waiting time 212 is taken as 1,500 milliseconds. At FIG. 11H the inversion waiting time 212 is taken as 2,500 milliseconds. As can be seen from inspection of the images of FIG. 11A–FIG. 11H the distortion of the images by noise is minimal, and the response of the images to different inversion times invT 212 is shown.

Figures 12A, 12B, 12C, 12D, 12E, 12F, 12G, 12H:
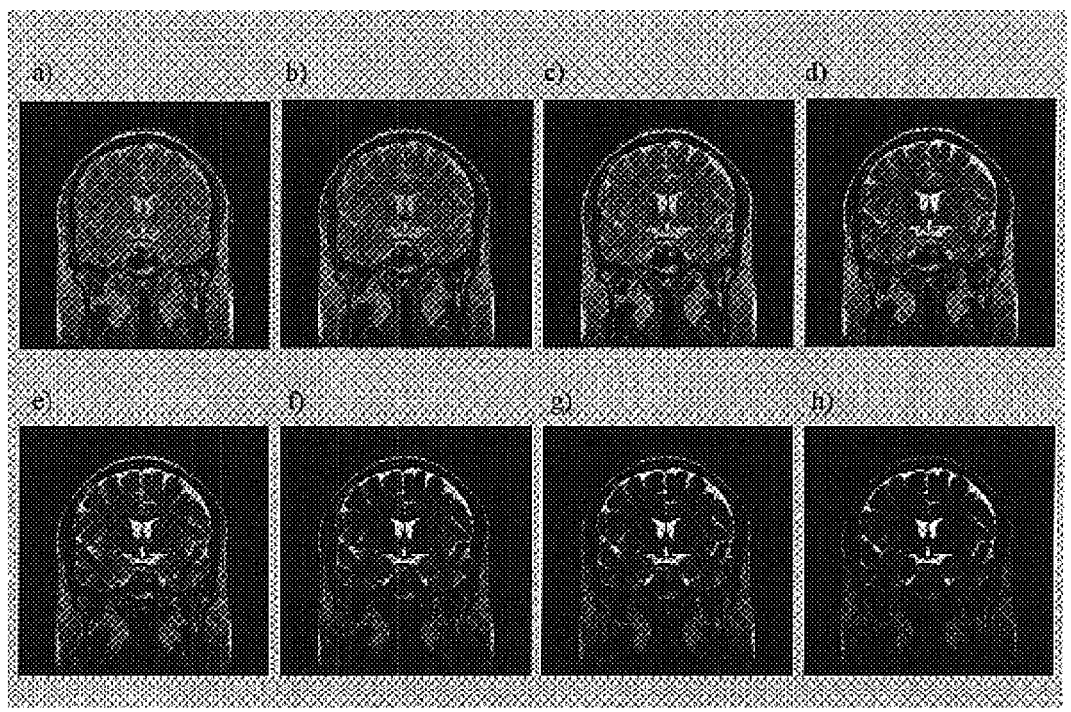
–FIG. 12H is a sequence of synthetic images for varying values of spin echo waiting time.

Turning now to FIG. 12A–FIG. 12H the effect on synthetic images of the brain obtained by changing the spin echo weighting times TE1 220, 254 and TE2 230, 270 is shown. The synthetic images computed by the inventive computational scheme at FIG. 12A shows the effect of using an echo waiting time of 0. At FIG. 12B the image using a spin echo time of 10 milliseconds is shown. At FIG. 12C the image obtained using a spin echo time of 15 milliseconds is shown. At FIG. 12D an image using a spin echo time of 30 milliseconds is shown. At FIG. 12E an image using a spin echo time of 60 milliseconds is shown. At FIG. 12F an image using a spin echo time of 90 milliseconds is shown. At FIG. 12G an image using a spin echo time of 120 milliseconds is shown. At FIG. 12H an image using a spin echo time of 200 milliseconds is shown. Examination of the images shown in FIG. 12A–FIG. 12H shows that the reconstructed images produced by the novel computational theme at block 302 are clear and substantially free of excessive noise. Further, the sequence of reconstructed images shows the effect of varying the spin echo waiting time TE1 220, 254, and TE2 230, 270. That is, the reconstructed images show the effect that taking a series of images of the patient at different spin echo-waiting times would produce.

FIG. 11A–FIG. 11H and FIG. 12A–FIG. 12H are reconstructed showing different parameter settings for a magnetic resonance image scanner, and all are computed using a set of four (4) images obtained as shown in the pulse sequence of FIG. 2, and as are illustrated for an exemplary embodiment of the invention in FIG. 5–FIG. 8.

Turning now to FIG. 13, a control system 13,000 for a magnetic resonance imagining scanner is shown. The longitudinal magnetic field coil 106 is not shown in FIG. 13 as ordinarily the longitudinal magnetic field is maintained at a constant value during the course of a scan, and FIG. 13 represents an exemplary control system for controlling hardware during a scan.

The gradient coils are shown, with the X gradient coil 13,002A and 13,002B connected by connection 13,004 to gradient drive circuits 13,006. The Y gradient coils 13,010A and 13,010B are connected by connection 13,012 to gradient drive circuits 13,006. Likewise, the Z gradient coils 13,014A and 13,014B are connected by connection 13,016 to gradient drive circuits 13,006. Gradient drive circuits 13,006 are connected to gradient control interface 13,020. The magnetic gradient coils are used to apply a desired value of magnetic field to a desired voxel of the patient's tissue.

Transmitter coil 150, as shown in FIG. 1, is connected to transmitter 13,024. Transmitter 13,024 is connected to transmitter control interface 13,026.

Radio frequency receiver coil 152, as shown in FIG. 1, is connected to receiver 13,030. Receiver 13,030 is connected to receiver control interface 13,032.

Transmitter control interface 13,026, gradient control interface 13,020, and receiver control interface 13,032 are connect to scan interface 13,034. Scan interface 13,034 is connected to computer bus 13,022.

Computer bus 13,022 is a data pathway connecting the control interfaces 13,026 and 13,020 and 13,032 to the other components of a computer. The other components of a computer comprise, for example, as follows. Central processor unit (CPU) 13,050 controls operation of MRI scanner 13,000.

Memory unit 13,052 connects to computer bus 13,022, and contains memory for computer programs which execute on CPU 13,050 and the data the programs work with. The LCSI module 13,053 storing the computer programs of the present invention is shown in memory 13,052.

Disk storage unit 13,057 provides additional storage for data and images.

Computer terminal 13,054, with monitor screen 13,055, and with keyboard 13,056 connects to computer bus 13,022.

Display unit 13,060 provides a high quality display for presenting the images obtained from patient 102 by the magnetic resonance image scanning process. Display 13,060 connects to computer bus 13,022.

Printer 13,062 also connects to computer bus 13,022 and provides a means for printing pictures of the images obtained by the magnetic resonance imaging scanner.

Network interface 13,070 connects to computer bus 13,022, and also provides connection to computer network 13,072.

In operation, magnetic resonance image scanner 100, and as shown with control system 13,000, is controlled by CPU 13,050.

In the exemplary embodiment of the invention shown in FIG. 13, scan interface 13,034 receives a command from CPU 13,050 to start a scan. Scan interface 13,034 controls the details of executing the scan. For example, scan interface 13,034 executes the pulse and scanning sequence described in connection with the exemplary pulse sequence of FIG. 2A. Scan interface 13,034 controls various components of the hardware, for example: scan interface 13,034 uses the transmitter control interface 13,026 to control the radio frequency transmitter 13,024; scan interface 13,034 uses gradient control interface to control the magnetic field gradient drive circuits 13,006; and, scan interface 13,034 uses receiver control interface 13,032 to control radio frequency receiver 13,030. For example, scan interface 13,034 may contain a processor to control the various interfaces connected thereto, in order to control the magnetic field, radio frequency transmission, and radio frequency reception, during the course of a scan.

CPU 13,050 also provides processing power to analyze image data obtained from the MRI scanner. The images are stored in memory 13,052 and on disk 13,057. The equations necessary to generate an image from the data acquired from radio frequency pickup coil 152 and receiver 13,030 are solved by CPU 13,050. The finished images are then stored in memory 13,052 and disk 13,057 by CPU 13,050. For example, the images shown as FIG. 5–FIG. 12$h$ are generated by data sent to memory 13,052, by receiver 13,030. That data then is converted into an image by CPU 13,050 and the images are stored into memory 13,052. LCSI module 13,053 stores the computer program for solving the equations of the invention as described hereinabove, and may, in an exemplary embodiment of the invention hold the images in appropriate data structures.

Terminal 13,054, and keyboard 13,056 provide a means for an operator to interface with the computer and MRI system. Display 13,060 is a high quality display which provides a means for presenting images generated by CPU 13,050 from the data received from receiver 13,030.

Printer 13,062 provides a means for printing images in a paper or photographic form.

Network interface 13,070 connects the computer system to a computer network 13,072 for transfer of information, images, etc., between MRI system 13,000 and other systems connected to computer network 13,072.

For example, the computer program used to solve the equations of the present invention may be loaded into memory 13,052 by being downloaded through computer network 13,072. Alternatively, disk unit 13,057 may contain a floppy disk unit, or a CD disk unit, and the computer program for practice of the present invention may be loaded from such a portable computer readable media.

It is to be understood that the above-described embodiments are simply illustrative of the principles of the invention. Various other modifications and changes may be made by those skilled in the art which embody the principles of the invention and fall within the spirit and scope thereof.

What is claimed is:

1. A method for analyzing data obtained from a magnetic resonance imaging scanner, comprising:

acquiring a plurality of directly acquired images by said magnetic resonance imaging scanner using a predefined pulse sequence;

forming a linear combination of said plurality of directly acquired images, said linear combination formed by summing a product of a coefficient and an image of said plurality of directly acquired images to form a sum of coefficients and images;

synthesizing a desired proton density image using said linear combination of said plurality of directly acquired images; and computing, in response to said proton density image, a synthesized virtual MR image.

2. The method of claim 1 wherein said step of forming a linear combination of said plurality of images further comprises:

combining said plurality of images using data to represent a quantitative proton density image of a patient anatomy.

3. The method of claim 1 wherein said step of forming a linear combination of said plurality of images further comprises:

combining said plurality of images using data representing a Fourier Transform of images of patient anatomy.

4. The method of claim 3 wherein said Fourier Transform further comprises a one dimensional Fourier Transform.

5. The method of claim 3 wherein said Fourier Transform further comprises a two dimensional Fourier Transform.

6. The method of claim 1, further comprising:
maximizing a signal to noise ratio in a chosen image.

7. The method of claim 1, further comprising:
minimizing pixel-by-pixel differences between an LCSI image and at least one of said acquired images.

8. The method of claim 1, further comprising:
maximizing a signal to noise ratio in a chosen image and simultaneously minimizing pixel-by-pixel differences with an image.

9. The method of claim 1 further comprising:
choosing a proton density image to have a maximum signal to noise ratio.

10. The method of claim 1, further comprising:
minimizing pixel-by-pixel differences between an LCSI image and a linear combination of at least one of said acquired images.

11. The method of claim 1, further comprising:
maximizing a signal to noise ratio in a chosen image and simultaneously minimizing pixel-by-pixel differences with a linear combination of said images.

12. Computer readable media containing instructions for execution in a processor for practice of the method of claim 1.

13. Electromagnetic signals travelling on a computer network, said electromagnetic signals carrying information for execution in a processor for practice of the method of claim 1.

14. The method of claim 1, further comprising:
acquiring as a directly acquired image an IR1_E1 image.

15. The method of claim 1, further comprising:
acquiring as a directly acquired image an IR1_E2 image.

16. The method of claim 1, further comprising:
acquiring as a directly acquired image an IR2_E1 image.

17. The method of claim 1, further comprising:
acquiring as a directly acquired image an IR2_E2 image.

18. The method of claim 1, further comprising:
computing said linear combination of said plurality of images using an IR1_E1 image and an IR_E2 image and an IR2_E1 image and an IR2_E2 image.

19. The method as in claim 18 further comprising:
choosing a set of linear combination coefficients to maximize a signal to noise ratio in said proton density image.

20. The method as in claim 1, further comprising:
computing said directly observed images by computing a Fourier Transform of signal data recorded by said magnetic resonance imaging scanner.

21. The method as in claim 1, further comprising:
computing tissue values of model parameters on a pixel by pixel basis; and
setting the tissue value to a predetermined value in response to a measured value of the image giving a calculated value within a specified range of noise value of the image.

22. The method of claim 21, further comprising:
setting a value of T1 to zero in the event that an image value in a pixel is less than a noise value.

23. The method of claim 21, further comprising:
setting a value of T2 equal to zero in the event that a pixel value in an image is less than a noise value for that pixel.

24. The method of claim 21, further comprising:
setting a value of T2 equal to the value of T2 for water for a pixel in the event that for said pixel the computed image value:

$$IR1\_EI - IR2\_E1$$

is less than a noise value for said pixel.

25. The method of claim 1, further comprising:
evaluating said coefficient to achieve a desired effect on said synthesized virtual MR image to give said coefficients a specific numerical value.

26. The method of claim 1, further comprising:
computing said synthesized virtual MR image in response to a virtual MRI pulse sequence.

27. The method as in claim 1, further comprising:
computing said synthesized virtual MR image using the equation $$\text{Synthetic}\_I_{(i,j)} = LCSI\_PD_{(i,j)} \cdot PSw[\{TE, TR, FA, \ldots\}_m; \{T1_{(i,j)}, T2_{(i,j)}, \ldots\}],$$

where $\text{Synthetic}\_I_{(i,j)}$ is the i,j pixel of the synthesized virtual MR image, $LCSI\_PD_{(i,j)}$ is the i,j pixel of the Proton Density image computed as a Linear Combination of Directly Acquired Images, $PSw[\{TE, TR, FA, \ldots\}_m; \{T1\{i,j\}, T2_{(i,j)}, \ldots\}]$ is the pulse sequence weighting factor for the virtual MR image, and the subscript m indicates a m'th directly acquired image.

28. A magnetic resonance imaging scanner, comprising:
means for acquiring a plurality of directly acquired images by said magnetic resonance imaging scanner using a predefined pulse sequence;
means for forming a linear combination of said plurality of directly acquired images, said linear combination formed by summing a product of a coefficient and an image of said plurality of directly acquired images to form a sum of coefficients and images;
means for synthesizing a desired proton density image using said linear combination of said plurality of directly acquired images; and
means for computing, in response to said proton density image, a synthesized virtual MR image.

29. The magnetic resonance imaging scanner of claim 28, further comprising:
means for evaluating said coefficients to achieve a desired effect on said image to give said coefficients a specific numerical value.

30. The magnetic resonance imaging scanner of claim 28, further comprising:

means for computing a synthesized virtual MR image using the equation, $$\text{Synthetic\_I}_{(i,j)} = \text{LCSI\_PD}_{(i,j)} \cdot \text{PSw}[\{TE, TR, FA, \ldots\}_m; \{T1_{(i,j)}, T2_{(i,j)}, \ldots\}],$$

where Synthetic_$I_{(i,j)}$ is the i,j pixel of the synthesized virtual MR image,
LCSI_$PD_{(i,j)}$ is the i,j pixel of the Proton Density image computed as a Linear Combination of Directly Acquired Images,
PSw[$\{TE, TR, FA, \ldots\}_m; \{T1\{i,j\}, T2_{(i,j)}, \ldots\}$] is the pulse sequence-weighting factor for the virtual MR image, and the subscript m indicates a m'th directly acquired image.

31. The magnetic resonance imaging scanner of claim 28, further comprising:

means for computing said synthesized virtual MR image in response to a virtual MRI pulse sequence.

32. A method for analyzing data obtained from a magnetic resonance imaging scanner, comprising:

acquiring a plurality of directly acquired images by said magnetic resonance imaging scanner using a predefined pulse sequence;

forming a linear combination of said plurality of directly acquired images, said linear combination formed by summing a product of a coefficient and an image of said plurality of directly acquired images to form a sum of coefficients and images;

synthesizing a desired proton density image using said linear combination of said plurality of directly acquired images; and computing, in response to said proton density image and in response to a virtual MRI pulse sequence, a synthesized virtual MR image.

33. A magnetic resonance imaging scanner, comprising:

means for acquiring a plurality of directly acquired images by said magnetic resonance imaging scanner using a predefined pulse sequence;

means for forming a linear combination of said plurality of directly acquired images, said linear combination formed by summing a product of a coefficient and an image of said plurality of directly acquired images to form a sum of coefficients and images;

means for synthesizing a desired proton density image using said linear combination of said plurality of directly acquired images;

means for computing, in response to said proton density image and in response to a virtual MRI pulse sequence, a synthesized virtual MR image.

34. A method for analyzing data obtained from a magnetic resonance imaging scanner, comprising:

acquiring a plurality of directly acquired images by said magnetic resonance imaging scanner using a first pulse sequence;

forming a linear combination of said plurality of directly acquired images, said linear combination formed by summing a product of a coefficient and an image of said plurality of directly acquired images to form a sum of coefficients and images;

synthesizing a desired proton density image using said linear combination of said plurality of directly acquired images;

computing a synthesized virtual MR image using the equation $$\text{Synthetic\_I}_{(i,j)} = \text{LCSI\_PD}_{(i,j)} \cdot \text{PSw}[\{TE, TR, FA, \ldots\}_m; \{T1_{(i,j)}, T2_{(i,j)}, \ldots\}],$$

where Synthetic_$I_{(i,j)}$ is the i,j pixel of the synthesized virtual MR image,
LCSI_$PD_{(i,j)}$ is the i,j pixel of the Proton Density image computed as a Linear Combination of Directly Acquired Images,
PSw[$\{TE, TR, FA, \ldots\}_m; \{T1\{i,j\}, T2_{(i,j)}, \ldots\}$] is the pulse sequence weighting factor for the virtual MR image, and the subscript m indicates a m'th directly acquired image; and computing the pulse sequence weighting factor PSw[$\{TE, TR, FA, \ldots\}_m; \{T1\{i,j\}, T2_{(i,j)}, \ldots\}$] for a virtual MRI pulse sequence.

35. A magnetic resonance imaging scanner, comprising:

means for acquiring a plurality of directly acquired images by said magnetic resonance imaging scanner using a first pulse sequence;

means for forming a linear combination of said plurality of directly acquired images, said linear combination formed by summing a product of a coefficient and an image of said plurality of directly acquired images to form a sum of coefficients and images;

means for synthesizing a desired proton density image using said linear combination of said plurality of directly acquired;

means for computing a synthesized virtual MR image using the equation $$\text{Synthetic\_I}_{(i,j)} = \text{LCSI\_PD}_{(i,j)} \cdot \text{PSw}[\{TE, TR, FA, \ldots\}_m; \{T1_{(i,j)}, T2_{(i,j)}, \ldots\}],$$

where Synthetic_$I_{(i,j)}$ is the i,j pixel of the synthesized virtual MR image,
LCSI_$PD_{(i,j)}$ is the i,j pixel of the Proton Density image computed as a Linear Combination of Directly Acquired Images,
PSw[$\{TE, TR, FA, \ldots\}_m; \{T1\{i,j\}, T2_{(i,j)}, \ldots\}$] is the pulse sequence weighting factor for the virtual MR image, and the subscript m indicates a m'th directly acquired image; and computing the pulse sequence weighting factor PSw[$\{TE, TR, FA, \ldots\}_m; \{T1\{i,j\}, T2_{(i,j)}, \ldots\}$] for a virtual MRI pulse sequence.

36. A method for analyzing data obtained from a magnetic resonance imaging scanner, comprising:

acquiring a plurality of directly acquired images by said magnetic resonance imaging scanner using a predefined pulse sequence;

in a computer remote from said magnetic resonance imaging scanner, performing the steps of, forming a linear combination of said plurality of directly acquired images, said linear combination formed by summing a product of a coefficient and an image of said plurality of directly acquired images to form a sum of coefficients and images;

synthesizing a desired proton density image using said linear combination of said plurality of directly acquired images; and computing, in response to said proton density image, a synthesized virtual MR image.

37. The method as in claim 36, further comprising:

acquiring a plurality of directly acquired images by said magnetic resonance imaging scanner using a predefined pulse sequence;

in said computer remote from said magnetic resonance imaging scanner, performing the steps of, forming a linear combination of said plurality of directly acquired images, said linear combination formed by summing a product of a coefficient and an image of said plurality of directly acquired images to form a sum of coefficients and images;

synthesizing a desired proton density image using said linear combination of said plurality of directly acquired images; and computing, in response to said proton density image, a synthesized virtual MR image.

38. The method as in claim 36, further comprising:

in said computer remote from said magnetic resonance imaging scanner, performing the steps of, evaluating said coefficients to achieve a desired effect on said image to give said coefficients a specific numerical value.

39. The method as in claim 36, further comprising:

in said computer remote from said magnetic resonance imaging scanner, performing the steps of, computing a synthesized virtual MR image using the equation, $$\text{Synthetic\_I}_{(i,j)} = \text{LCSI\_PD}_{(i,j)} \cdot \text{PSw}[\{TE, TR, FA, \ldots\}_m; \{T1_{(i,j)}, T2_{(i,j)}, \ldots\}],$$

where $\text{Synthetic\_I}_{(i,j)}$ is the i,j pixel of the synthesized virtual MR image, $\text{LCSI\_PD}_{(i,j)}$ is the i,j pixel of the Proton Density image computed as a Linear Combination of Directly Acquired Images, $\text{PSw}[\{TE, TR, FA, \ldots\}_m; \{T1\{i,j\}, T2_{(i,j)}, \ldots\}]$ is the pulse sequence-weighting factor for the virtual MR image, and the subscript m indicates a m'th directly acquired image.

40. The method as in claim 36, further comprising:

in said computer remote from said magnetic resonance imaging scanner, performing the steps of, computing said synthesized virtual MR image in response to a virtual MRI pulse sequence.

\* \* \* \* \*